(12) United States Patent
Costa et al.

(10) Patent No.: US 10,643,886 B2
(45) Date of Patent: May 5, 2020

(54) AIR-CAVITY MODULE WITH ENHANCED DEVICE ISOLATION

(71) Applicant: Qorvo US, Inc., Greensboro, NC (US)

(72) Inventors: Julio C. Costa, Oak Ridge, NC (US); George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/873,152

(22) Filed: Jan. 17, 2018

(65) Prior Publication Data

US 2018/0138082 A1     May 17, 2018

Related U.S. Application Data

(63) Continuation-in-part of application No. 15/652,826, filed on Jul. 18, 2017, now Pat. No. 10,468,329,
(Continued)

(51) Int. Cl.
*H01L 21/762* (2006.01)
*H01L 23/31* (2006.01)
(Continued)

(52) U.S. Cl.
CPC .. *H01L 21/76289* (2013.01); *H01L 21/30604* (2013.01); *H01L 21/56* (2013.01);
(Continued)

(58) Field of Classification Search
None
See application file for complete search history.

(56) References Cited

U.S. PATENT DOCUMENTS

| 4,093,562 A | 6/1978 | Kishimoto |
| 4,366,202 A | 12/1982 | Borovsky |

(Continued)

FOREIGN PATENT DOCUMENTS

| CN | 103811474 A | 5/2014 |
| CN | 103872012 A | 6/2014 |

(Continued)

OTHER PUBLICATIONS

Notice of Allowance for U.S. Appl. No. 15/387,855, dated Aug. 10, 2018, 7 pages.
(Continued)

*Primary Examiner* — Bo B Jang
(74) *Attorney, Agent, or Firm* — Withrow & Terranova, P.L.L.C.

(57) ABSTRACT

The present disclosure relates to an air-cavity module having a thinned semiconductor die and a mold compound. The thinned semiconductor die includes a back-end-of-line (BEOL) layer, an epitaxial layer over the BEOL layer, and a buried oxide (BOX) layer with discrete holes over the epitaxial layer. The epitaxial layer includes an air-cavity, a first device section, and a second device section. Herein, the air-cavity is in between the first device section and the second device section and directly in connection with each discrete hole in the BOX layer. The mold compound resides directly over at least a portion of the BOX layer, within which the discrete holes are located. The mold compound does not enter into the air-cavity through the discrete holes.

21 Claims, 14 Drawing Sheets

Related U.S. Application Data which is a continuation-in-part of application No. 15/601,858, filed on May 22, 2017.

(60) Provisional application No. 62/447,111, filed on Jan. 17, 2017, provisional application No. 62/339,322, filed on May 20, 2016, provisional application No. 62/363,499, filed on Jul. 18, 2016.

(51) Int. Cl.
*H01L 23/29* (2006.01)
*H01L 21/306* (2006.01)
*H01L 21/56* (2006.01)
*H01L 27/12* (2006.01)

(52) U.S. Cl.
CPC ......... *H01L 23/293* (2013.01); *H01L 23/315* (2013.01); *H01L 23/3171* (2013.01); *H01L 23/3192* (2013.01); H01L 23/3128 (2013.01); H01L 23/3135 (2013.01); H01L 27/1203 (2013.01)

(56) References Cited

U.S. PATENT DOCUMENTS

| | | | |
|---|---|---|---|
| 5,013,681 A | 5/1991 | Godbey et al. | |
| 5,061,663 A | 10/1991 | Bolt et al. | |
| 5,069,626 A | 12/1991 | Patterson et al. | |
| 5,362,972 A | 11/1994 | Yazawa et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,729,075 A * | 3/1998 | Strain .................. | G01H 11/06 310/309 |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,377,112 B1 | 4/2002 | Rozsypal | |
| 6,423,570 B1 | 7/2002 | Ma et al. | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,238,560 B2 | 7/2007 | Sheppard et al. | |
| 7,279,750 B2 | 10/2007 | Jobetto | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,489,032 B2 | 2/2009 | Jobetto | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,843,072 B1 | 11/2010 | Park et al. | |
| 7,855,101 B2 | 12/2010 | Furman et al. | |
| 7,868,419 B1 | 1/2011 | Kerr et al. | |
| 7,910,405 B2 | 3/2011 | Okada et al. | |
| 7,960,218 B2 | 6/2011 | Ma et al. | |
| 8,004,089 B2 | 8/2011 | Jobetto | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,658,475 B1 | 2/2014 | Kerr | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,803,242 B2 | 8/2014 | Marino et al. | |
| 8,816,407 B2 | 8/2014 | Kim et al. | |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 8,983,399 B2 | 3/2015 | Kawamura et al. | |
| 9,165,793 B1 | 10/2015 | Wang et al. | |
| 9,214,337 B2 | 12/2015 | Carroll et al. | |
| 9,349,700 B2 | 5/2016 | Hsieh et al. | |
| 9,368,429 B2 | 6/2016 | Ma et al. | |
| 9,461,001 B1 | 10/2016 | Tsai et al. | |
| 9,520,428 B2 | 12/2016 | Fujimori | |
| 9,530,709 B2 | 12/2016 | Leipold et al. | |
| 9,613,831 B2 | 4/2017 | Morris et al. | |
| 9,646,856 B2 | 5/2017 | Meyer et al. | |
| 9,653,428 B1 | 5/2017 | Hiner et al. | |
| 9,786,586 B1 | 10/2017 | Shih | |
| 9,812,350 B2 | 11/2017 | Costa | |
| 9,824,951 B2 | 11/2017 | Leipold et al. | |
| 9,824,974 B2 | 11/2017 | Gao et al. | |
| 9,859,254 B1 | 1/2018 | Yu et al. | |
| 9,875,971 B2 | 1/2018 | Bhushan et al. | |
| 9,941,245 B2 | 4/2018 | Skeete et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 | 9/2002 | Ma et al. | |
| 2002/0137263 A1 | 9/2002 | Towle et al. | |
| 2002/0185675 A1 | 12/2002 | Furukawa | |
| 2003/0207515 A1 | 11/2003 | Tan et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0057782 A1 | 3/2006 | Gardes et al. | |
| 2006/0105496 A1 | 5/2006 | Chen et al. | |
| 2006/0108585 A1 | 5/2006 | Gan et al. | |
| 2006/0228074 A1 | 10/2006 | Lipson et al. | |
| 2006/0261446 A1 | 11/2006 | Wood et al. | |
| 2007/0020807 A1 | 1/2007 | Geefay et al. | |
| 2007/0069393 A1 | 3/2007 | Asahi et al. | |
| 2007/0075317 A1 | 4/2007 | Kato et al. | |
| 2007/0121326 A1 | 5/2007 | Nall et al. | |
| 2007/0158746 A1 | 7/2007 | Ohguro | |
| 2007/0181992 A1 | 8/2007 | Lake | |
| 2007/0190747 A1 | 8/2007 | Humpston et al. | |
| 2007/0194342 A1 | 8/2007 | Kinzer | |
| 2007/0252481 A1 | 11/2007 | Iwamoto et al. | |
| 2007/0276092 A1 | 11/2007 | Kanae et al. | |
| 2008/0050852 A1 | 2/2008 | Hwang et al. | |
| 2008/0050901 A1 | 2/2008 | Kweon et al. | |
| 2008/0164528 A1 | 7/2008 | Cohen et al. | |
| 2008/0265978 A1 | 10/2008 | Englekirk | |
| 2008/0272497 A1 | 11/2008 | Lake | |
| 2008/0315372 A1 | 12/2008 | Kuan et al. | |

(56) References Cited

U.S. PATENT DOCUMENTS

| | | |
|---|---|---|
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1* | 7/2015 | Cheng .................. B81B 7/0006 257/418 |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0053938 A1 | 2/2017 | Whitefield |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0145678 A1 | 5/2018 | Maxim et al. |
| 2018/0166358 A1 | 6/2018 | Costa et al. |
| 2018/0269188 A1 | 9/2018 | Yu et al. |
| 2019/0172842 A1 | 6/2019 | Whitefield |
| 2019/0189599 A1 | 6/2019 | Baloglu et al. |

FOREIGN PATENT DOCUMENTS

| | | |
|---|---|---|
| EP | 2996143 A1 | 3/2016 |
| JP | S505733 Y1 | 2/1975 |
| JP | H11-220077 A | 8/1999 |
| JP | 200293957 A | 3/2002 |
| JP | 2002252376 A | 9/2002 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2011243596 A | 12/2011 |
| WO | 2007074651 A1 | 7/2007 |

OTHER PUBLICATIONS

Notice of Allowance and Applicant-Initiated Interview Summary for U.S. Appl. No. 15/262,457, dated Sep. 28, 2018, 16 pages.

Corrected Notice of Allowance for U.S. Appl. No. 15/676,693, dated Aug. 29, 2018, 5 pages.

Notice of Allowance for U.S. Appl. No. 15/914,538, dated Aug. 1, 2018, 9 pages.

Non-Final Office Action for U.S. Appl. No. 15/695,579, dated Jan. 28, 2019, 8 pages.

Notice of Allowance for U.S. Appl. No. 15/695,579, dated Mar. 20, 2019, 8 pages.

Non-Final Office Action for U.S. Appl. No. 15/992,613, dated Feb. 27, 2019, 15 pages.

International Preliminary Report on Patentability for PCT/US2017/046744, dated Feb. 21, 2019, 11 pages.

(56) References Cited

OTHER PUBLICATIONS

International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
First Office Action for Chinese Patent Application No. 201510746323.X, dated Nov. 2, 2018, 12 pages.
Notice of Allowance for U.S. Appl. No. 16/038,879, dated Jan. 9, 2019, 8 pages.
Non-Final Office Action for U.S. Appl. No. 15/945,418, dated Nov. 1, 2018, 13 pages.
Final Office Action for U.S. Appl. No. 15/601,858, dated Nov. 26, 2018, 16 pages.
Advisory Action for U.S. Appl. No. 15/601,858, dated Jan. 22, 2019, 3 pages.
Notice of Allowance for U.S. Appl. No. 16/004,961, dated Jan. 11, 2019, 8 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.

(56) References Cited

OTHER PUBLICATIONS

Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.

Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "Re Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.

(56) References Cited

OTHER PUBLICATIONS

Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Notice of Allowance for U.S. Appl. No. 16/004,961, dated May 13, 2019, 8 pages.
Final Office Action for U.S. Appl. No. 15/992,613, dated May 24, 2019, 11 pages.
Notice of Allowance for U.S. Appl. No. 15/992,639, dated May 9, 2019, 7 pages.
Notice of Allowance for U.S. Appl. No. 16/168,327, dated Jun. 28, 2019, 7 pages.
Non-Final Office Action for U.S. Appl. No. 15/601,858, dated Apr. 17, 2019, 9 pages.
Notice of Allowance for U.S. Appl. No. 16/004,961, dated Aug. 28, 2019, 8 pages.
Notice of Allowance for U.S. Appl. No. 15/601,858, dated Aug. 16, 2019, 8 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.

(56) References Cited

OTHER PUBLICATIONS

Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Tsai, Chun-Lin, et al., "Smart GaN platform; Performance & Challenges," IEEE International Electron Devices Meeting, 2017, 4 pages.
Notice of Reasons for Refusal for Japanese Patent Application No. 2015-180657, dated Jul. 9, 2019, 4 pages.
Advisory Action for U.S. Appl. No. 15/992,613, dated Jul. 29, 2019, 3 pages.
Notice of Allowance for U.S. Appl. No. 15/975,230, dated Jul. 22, 2019, 7 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
International Search Report and Written Opinion for International Patent Application No. PCT/US19/25591, dated Jun. 21, 2019, 7 pages.
Non-Final Office Action for U.S. Appl. No. 16/527,702, dated Jan. 10, 2020, 10 pages.
Office Action for Japanese Patent Application No. 2018-526613, dated Nov. 5, 2019, 8 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Intention to Grant for European Patent Application No. 17757646.9, dated Feb. 27, 2020, 55 pages.
Corrected Notice of Allowability for U.S. Appl. No. 15/695,579, dated Feb. 5, 2020, 5 pages.

\* cited by examiner

US 10,643,886 B2

AIR-CAVITY MODULE WITH ENHANCED DEVICE ISOLATION

RELATED APPLICATIONS

This application claims the benefit of provisional patent application Ser. No. 62/447,111, filed Jan. 17, 2017.

This application claims priority to and is a continuation-in-part of U.S. patent application Ser. No. 15/601,858, filed May 22, 2017, published as U.S. Patent Application Publication No. 2017/0334710 on Nov. 23, 2017, entitled WAFER-LEVEL PACKAGE WITH ENHANCED PERFORMANCE, which claims the benefit of U.S. provisional patent application Ser. No. 62/339,322, filed May 20, 2016.

This application claims priority to and is a continuation-in-part of U.S. patent application Ser. No. 15/652,826, filed Jul. 18, 2017, now patented as U.S. Pat. No. 10,478,329 on Nov. 5, 2019, entitled THERMALLY ENHANCED SEMICONDUCTOR PACKAGE HAVING FIELD EFFECT TRANSISTORS WITH BACK-GATE FEATURE, which claims the benefit of U.S. provisional patent application Ser. No. 62/363,499, filed Jul. 18, 2016.

All of the applications listed above are hereby incorporated herein by reference in their entireties.

FIELD OF THE DISCLOSURE

The present disclosure relates to an air-cavity module and a process for making the same, and more particularly to an air-cavity module with enhanced device isolation, and a process for enhancing isolation performance between devices within the air-cavity module.

BACKGROUND

Silicon-on-insulator (SOI) structures are widely used to form semiconductor packages due to the low cost of silicon materials, large scale capacity of wafer production, well-established semiconductor design tools, and well-established semiconductor manufacturing techniques. Within a conventional semiconductor package formed from a SOI structure, parasitic coupling effects between devices are dominated by both the vertical parasitic coupling through the silicon handle layer of the SOI structure and the lateral parasitic coupling through the shallow trench isolation (STI) within the epitaxial layer.

For modern communication applications, a high degree of isolation between signal paths is highly desired. This in turn requires a low degree of parasitic coupling between devices. Normally, a significant spacing between devices, like switches, is used to ensure good isolation between different signal paths. However, the significant spacing between the devices will largely increase the solution area and cost.

Accordingly, there remains a need for improved semiconductor package designs with SOI structures to reduce parasitic coupling effects between devices within the semiconductor package. In addition, there is also a need to keep the size and cost of the final semiconductor package effective.

SUMMARY

The present disclosure relates to an air-cavity module with enhanced device isolation. The disclosed air-cavity module has a thinned semiconductor die and a first mold compound. The thinned semiconductor die includes a back-end-of-line (BEOL) layer, an epitaxial layer, and a buried oxide (BOX) layer. The BEOL layer has an upper surface that includes a first surface portion and a second surface portion surrounding the first surface portion. The epitaxial layer resides over the upper surface of the BEOL layer and includes an air-cavity, a first device section, and a second device section. Herein, the air-cavity is over the first surface portion and not over the second surface portion. The first device section and the second device section are located on opposite sides of the air-cavity. The first device section and the second device section are over the second surface portion and not over the first surface portion. The BOX layer has a number of discrete holes and is over the epitaxial layer. The discrete holes are over the first surface portion and not over the second surface portion, and directly in connection with the air-cavity. The first mold compound resides directly over at least a portion of the BOX layer, within which the discrete holes are located. The first mold compound does not enter into the air-cavity of the epitaxial layer through the discrete holes within the BOX layer.

In one embodiment of the air-cavity module, the first mold compound has a relative permittivity of no more than 7.

In one embodiment of the air-cavity module, the first mold compound has a relative permittivity of no more than 4.

In one embodiment of the air-cavity module, the first mold compound is formed of polymer granules. Each polymer granule is larger than any of the discrete holes.

In one embodiment of the air-cavity module, a diameter of each discrete hole is between 0.1 µm and 100 µm, and a diameter of each polymer granule is between 0.2 µm and 500 µm The apparatus of claim 4 wherein a diameter of each of the plurality of discrete holes is between 0.2 µm and 1 µm, and a diameter of each polymer granule is between 0.5 µm and 50 µm.

In one embodiment of the air-cavity module, a shape of each discrete hole is one of a group consisting of a cuboid, a cylinder, and a circular truncated cone.

According to another embodiment, the air-cavity further includes a thermally enhanced mold compound that resides over the first mold compound.

In one embodiment of the air-cavity module, the first mold compound and the thermally enhanced mold compound are formed from an identical material.

In one embodiment of the air-cavity module, the first mold compound and the thermally enhanced mold compound are formed from different materials.

In one embodiment of the air-cavity module, the epitaxial layer further includes isolation sections. Herein, the isolation sections surround the first device section and the second device section, and separate the first device section and the second device section from the air-cavity. The isolation sections are over the second surface portion and not over the first surface portion.

In one embodiment of the air-cavity module, the first device section includes a first source, a first drain, and a first channel for a first field effect transistor (FET), and the second device section includes a second source, a second drain, and a second channel for a second FET.

In one embodiment of the air-cavity module, the first mold compound is directly over the entire BOX layer.

According to another embodiment, the air-cavity module further includes a low permittivity mold compound. Herein, the first mold compound resides directly over a first portion of the BOX layer, within which the discrete holes are located. The low permittivity mold compound resides directly over second portions of the BOX layer, within which the discrete holes are not located. The low permittivity mold compound at least partially encapsulates the sides of the first mold compound.

In one embodiment of the air-cavity module, the low permittivity mold compound has a relative permittivity of no more than 7.

According to another embodiment, the air-cavity module further includes a thermally enhanced mold compound that resides over the first mold compound. The low permittivity mold compound at least partially encapsulates the sides of the thermally enhanced mold compound.

In one embodiment of the air-cavity module, the low permittivity mold compound and the thermally enhanced mold compound are formed from an identical material.

In one embodiment of the air-cavity module, the low permittivity mold compound and the thermally enhanced mold compound are formed from different materials.

According to another embodiment, the air-cavity module is included in a laminate-based semiconductor package. Besides the air-cavity module, the laminate-based semiconductor package also includes a module substrate and a second mold compound. Herein, the thinned semiconductor die is a flip-chip die and further includes a number of interconnects extending from a lower surface of the BEOL layer towards an upper surface of the module substrate. The second mold compound resides over the upper surface of the module substrate and encapsulates at least sides of the first mold compound and the thinned semiconductor die.

According to another embodiment, the air-cavity module is included in a wafer-level package. Besides the air-cavity module, the wafer-level package also includes a multilayer redistribution structure and a second mold compound. Herein, the thinned semiconductor die resides directly over an upper surface of the multilayer redistribution structure. The second mold compound resides over the upper surface of multilayer redistribution structure and encapsulates at least sides of the first mold compound and the thinned semiconductor die.

According to another embodiment, an air-cavity module has a thinned semiconductor die and a first mold compound. The thinned semiconductor die includes a BEOL layer, an epitaxial layer, and a BOX layer. The BEOL layer has an upper surface that includes a first surface portion and a second surface portion surrounding the first surface portion. The epitaxial layer resides over the upper surface of the BEOL layer and includes air-cavities, support structures, a first device section, and a second device section. Herein, the air-cavities and the support structures are over the first surface portion and not over the second surface portion. The first device section and the second device section are over the second surface portion and not over the first surface portion. The air-cavities are in between the first device section and the second device section. The air-cavities are separated from each other by the support structures. The BOX layer has a number of discrete holes and is over the epitaxial layer. The discrete holes are over the first surface portion and not over the second surface portion. Each air-cavity is directly in connection with at least one discrete hole. The support structures provide mechanical support to a first portion of the BOX layer, within which the discrete holes are located. The first mold compound directly resides over at least the first portion of the BOX layer and does not enter into the air-cavity of the epitaxial layer through the discrete holes within the BOX layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
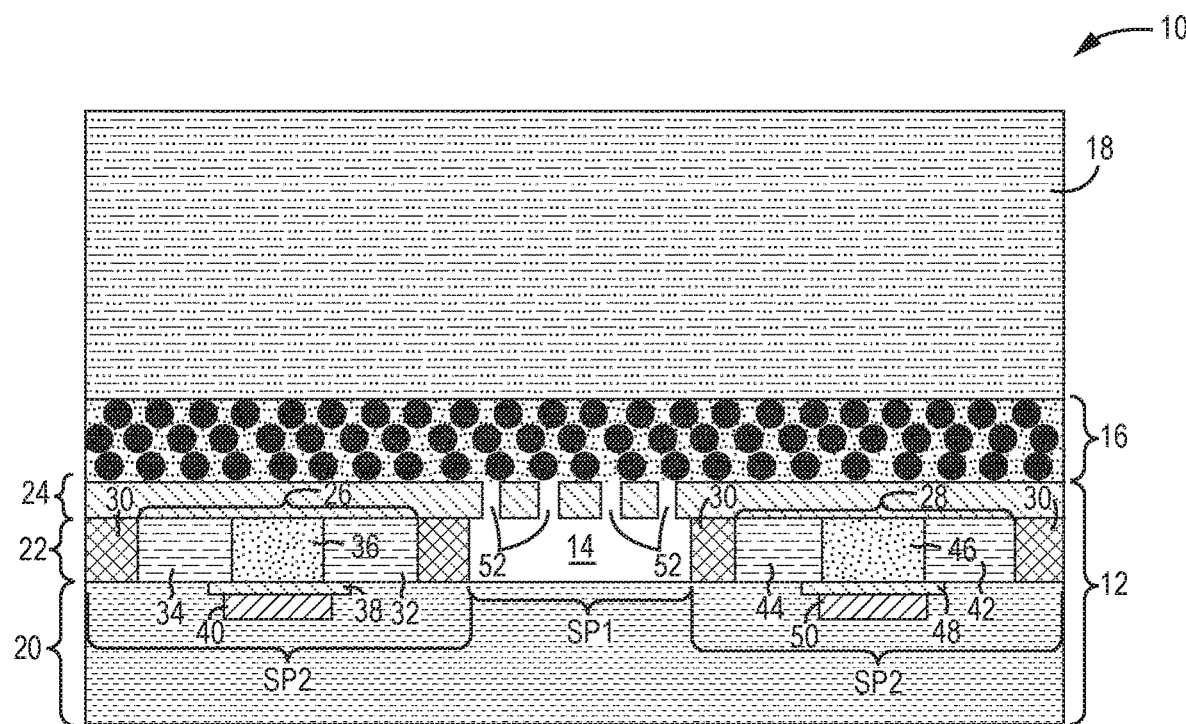
FIG. 1A and FIG. 1B show an exemplary air-cavity module according to one embodiment of the present disclosure.

It will be understood that for clear illustrations, FIGS. 1A-10G may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to an air-cavity module with enhanced device isolation, and a process for making the same. FIG. 1A shows a cross-sectional view of an exemplary air-cavity module 10 according to one embodiment of the present disclosure. For the purpose of this illustration, the air-cavity module 10 includes a thinned semiconductor die 12 with an air-cavity 14, a first mold compound 16, and a thermally enhanced mold compound 18.

In detail, the thinned semiconductor die 12 includes a back-end-of-line (BEOL) layer 20, an epitaxial layer 22 over an upper surface of the BEOL layer 20, and a buried oxide (BOX) layer 24 over the epitaxial layer 22. Herein, the upper surface of the BEOL layer 20 includes a first surface portion SP1 and a second surface portion SP2, which surrounds the first surface portion SP1. The epitaxial layer 22 includes the air-cavity 14, a first device section 26, a second device section 28, and isolation sections 30. The first device section 26 and the second device section 28 are located on opposite sides of the air-cavity 14, and both the first device section 26 and the second device section 28 are surrounded by the isolation sections 30. As such, the air-cavity 14 is isolated from the first device section 26 and the second device section 28 by the isolation sections 30. The isolation sections 30 may be formed by shallow trench isolation (STI). The air-cavity 14 is over the first surface portion SP1 and not over the second surface portion SP2. The first device section 26, the second device section 28, and the isolation sections 30 are over the second surface portion SP2 and not over the first surface portion SP1. In different applications, the epitaxial layer 22 may include more device sections and more air-cavities between adjacent device sections.

In one embodiment, the first device section 26 and the second device section 28 may be used to form field effect transistor (FET) switches. The first device section 26 may include a first source 32, a first drain 34, and a first channel 36 between the first source 32 and the first drain 34. The isolation sections 30 surround the first source 32 and the first drain 34. In addition, there is a first gate dielectric 38 and a first gate structure 40 aligned below the first channel 36 and formed within the BEOL layer 20. Herein, the first gate dielectric 38 and the first gate structure 40 are underlying the second surface portion SP2 and not underlying the first surface portion SP1. The first source 32, the first drain 34, and the first channel 36 within the epitaxial layer 22, and the first gate dielectric 38 and the first gate structure 40 within the BEOL layer 20 form a first FET switch. Similarly, the second device section 28 may include a second source 42, a second drain 44, and a second channel 46 between the second source 42 and the second drain 44. The isolation sections 30 surround the second source 42 and the second drain 44. In addition, there is a second gate dielectric 48 and a second gate structure 50 aligned below the second channel 46 and formed within the BEOL layer 20. Herein, the second gate dielectric 48 and the second gate structure 50 are underlying the second surface portion SP2 and not underlying the first surface portion SP1. The second source 42, the second drain 44, and the second channel 46 within the epitaxial layer 22, and the second gate dielectric 48 and the second gate structure 50 within the BEOL layer 20 form a second FET switch.

It is clear to those skilled in the art that the first FET switch formed from the first device section 26 and the second FET switch formed from the second device section 28 are laterally separated by the air-cavity 14. Since the relative permittivity of the air (around 1) is very small (compared to other materials, such as silicon, silicon oxide, or thermal conductive polymer, which may be used between the first device section 26 and the second device section 28), a lateral parasitic coupling effect between the first device section 26 and the second device section 28 is low. The first FET switch and the second FET switch have superior isolation. For a designated isolation, using an air-cavity may reduce the lateral distance between the first FET switch and the second FET switch, and consequently result in significant die area reduction.

Figure 1B:
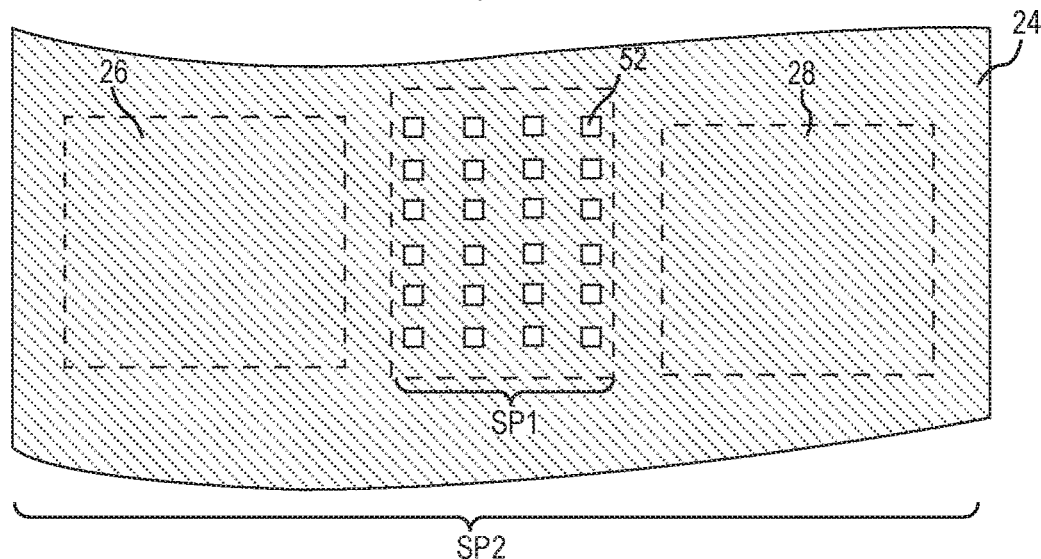

The BOX layer 24 has a number of discrete holes 52, which are directly in connection with the air-cavity 14 in the epitaxial layer 22. The discrete holes 52 may or may not have the same size. The shape of each discrete hole 52 may be a cuboid, a cylinder, or a circular truncated cone that has a larger opening close to the air-cavity 14 and has a smaller opening close to the first mold compound 16. As shown in FIG. 1B, the discrete holes 52 are over the first surface portion SP1 and not over the second surface portion SP2. It is clear to those skilled in the art that the BOX layer 24 is continuous and the discrete holes 52 do not segment the BOX layer 24 into individual pieces. There is no portion of the BOX layer 24 that is floating.

The first mold compound 16 is formed over the thinned semiconductor die 12 and in contact with the BOX layer 24.

The first mold compound 16 may have a thickness between 1 μm and 250 μm, and may be formed from large granularity polymers that cannot go through any of the discrete holes 52 into the air-cavity 14. The polymer granules used for the first mold compound 16 may or may not have the same size. The smallest polymer granule is larger than any of the discrete holes 52. The diameter of one discrete hole 52 may be between 0.1 μm and 100 μm or between 0.2 μm and 1 μm. The diameter of one polymer granule may be from 0.2 μm and 500 μm or between 0.5 μm and 50 μm. Notice that, there are no air gaps between the polymer granules. Resins of the polymer granules may fill the gaps between the polymer granules. In addition, the first mold compound 16 may be formed from low relative permittivity materials with the relative permittivity being no more than 7 or no more than 4. Organic thermoset and thermoplastic polymer with large granularity may be used for the first mold compound 16. Because the first mold compound 16 is adjacent to the first device section 26 and the second device section 28, a vertical parasitic coupling effect between the first device section 26 and the second device section 28 is low. Most parasitic field lines between the first device section 26 and the second device section 28 close through the first mold compound 16.

Further, the thermally enhanced mold compound 18 is formed over the first mold compound 16. Unlike the first mold compound 16, the thermally enhanced mold compound 18 does not have a granularity requirement or a relative permittivity requirement. The thermally enhanced mold compound 18 may have a thickness between 50 μm and 1000 μm, and may be formed of thermal conductive polymer with fine granularity (<500 μm or preferably <50 μm). The thermally enhanced mold compound 18 may have a thermal conductivity between 10 W/m·K and 50 W/mK, or between 1 W/m·K and 500 W/m·K or greater. The higher the thermal conductivity of the thermally enhanced mold compound 18, the better the heat dissipation performance of the air-cavity module 10.

Figure 2A:
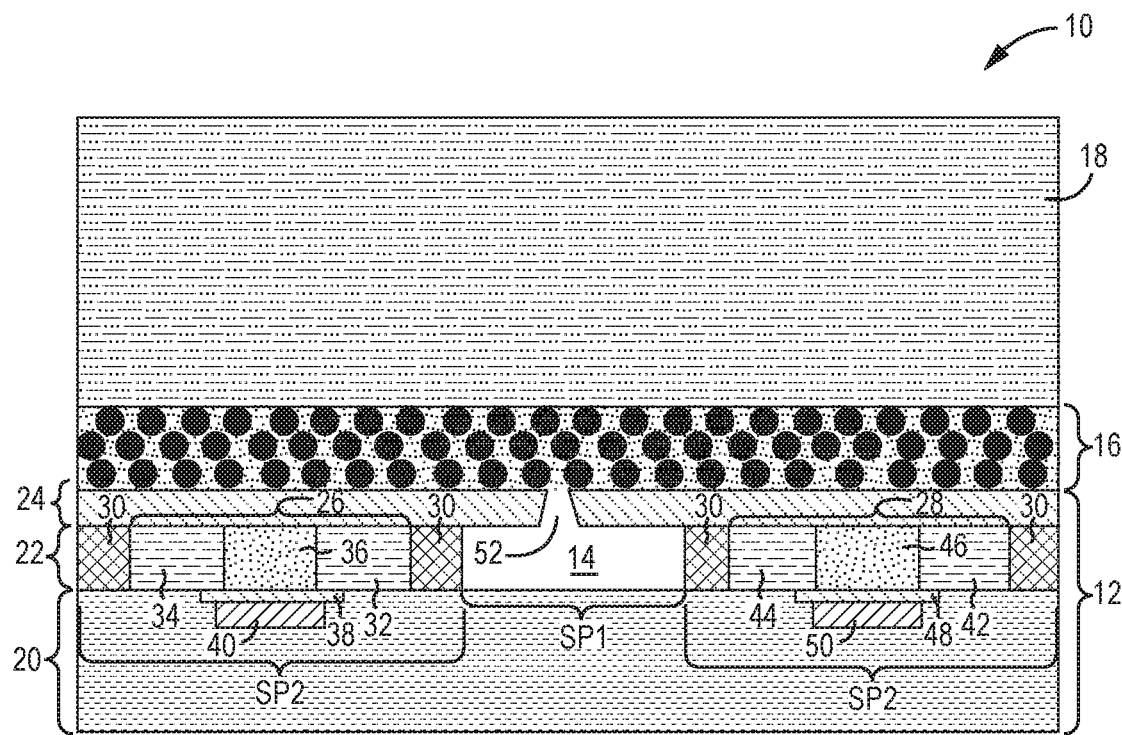
FIG. 2A and FIG. 2B show an alternative air-cavity module according to one embodiment of the present disclosure.
Figure 2B:
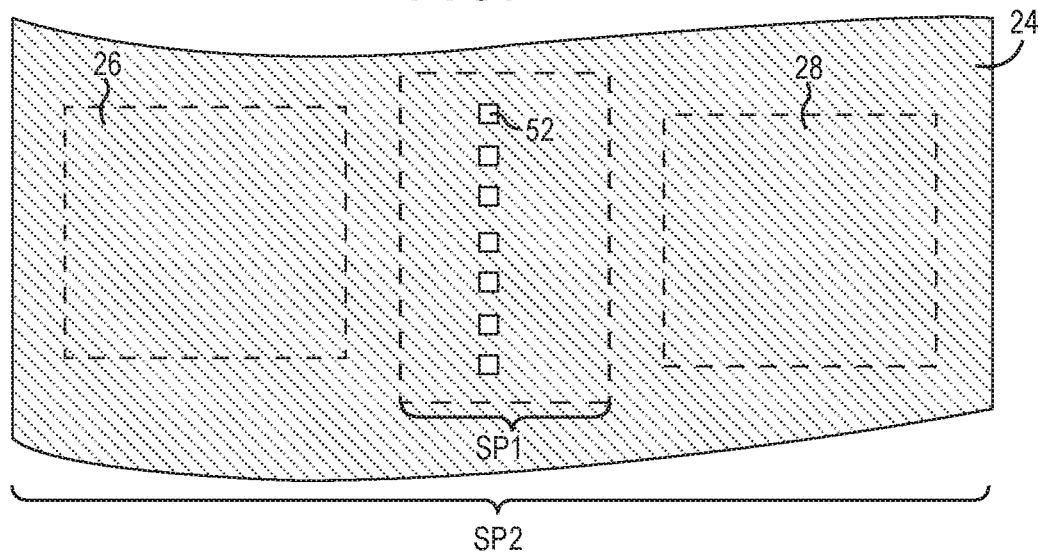

In different applications, the BOX layer 24 may include fewer or more discrete holes 52 with different configurations. As shown in FIGS. 2A and 2B, the BOX layer 24 may only include a row of the discrete holes 52. Herein, the BOX layer 24 is still continuous and the discrete holes 52 do not segment the BOX layer 24 into individual pieces. There is no portion of the BOX layer 24 that is floating. In general, the fewer discrete holes 52 the BOX layer 24 has, the better mechanical strength the BOX layer 24 owns.

Figure 3:
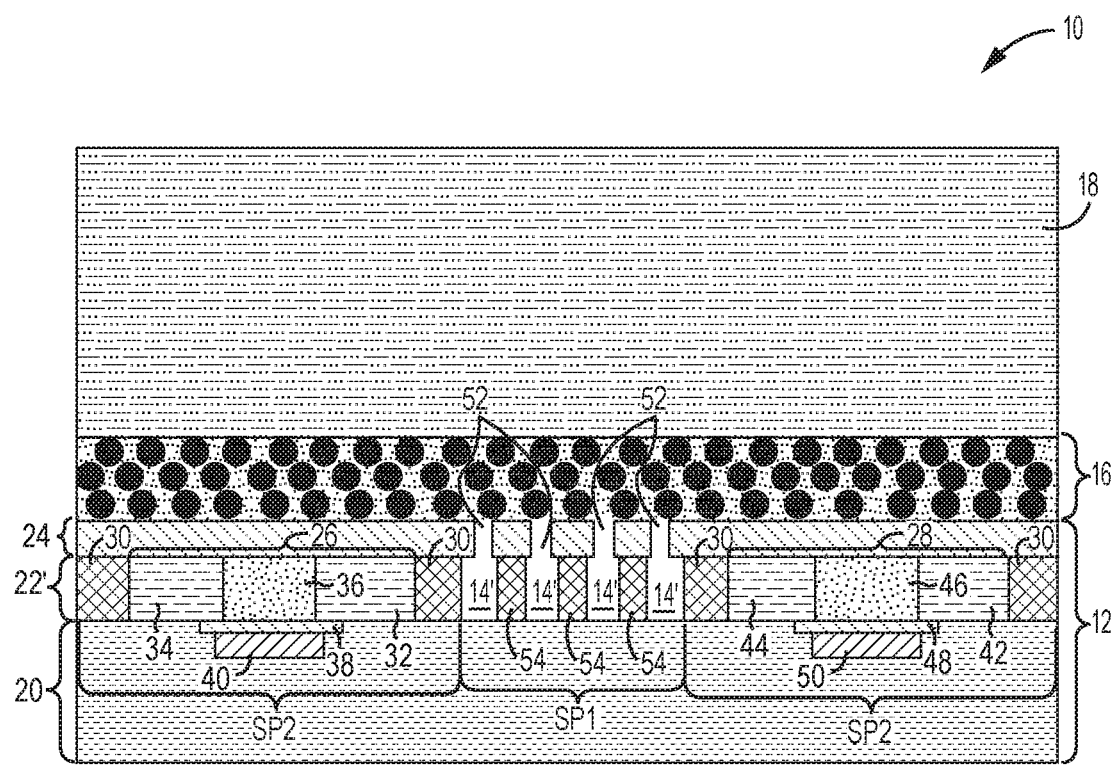
FIG. 3 shows an alternative air-cavity module according to one embodiment of the present disclosure.

In another embodiment of the air-cavity module 10, an epitaxial layer 22' may further include support structures 54 over the first surface portion SP1 of the BEOL layer 20, as illustrated in FIG. 3. The support structures 54 provide mechanical support to a portion of the BOX layer 24, within which the discrete holes 52 are located. Herein, the epitaxial layer 22' may include multiple air-cavities 14' instead of a single air-cavity 14 over the first surface portion SP1 of the BEOL layer 20. The multiple air-cavities 14' are in between the first device section 26 and the second device section 28, and may be separated from each other by the support structures 54. Each air-cavity 14' is directly in connection with at least one of the discrete holes 52 in the BOX layer 24, and may be formed between the isolation sections 30 and the support structures 54 or between adjacent support structures 54. With these the support structures 54, the BOX layer 24 gets extra mechanical support, and each air-cavity 14' under the BOX layer 24 has a relatively small size. As such, the BOX layer 24 may endure higher vertical pressure. The support structures 54 and the isolation sections 30 may be formed of silicon oxide in a same STI process.

Figure 4:
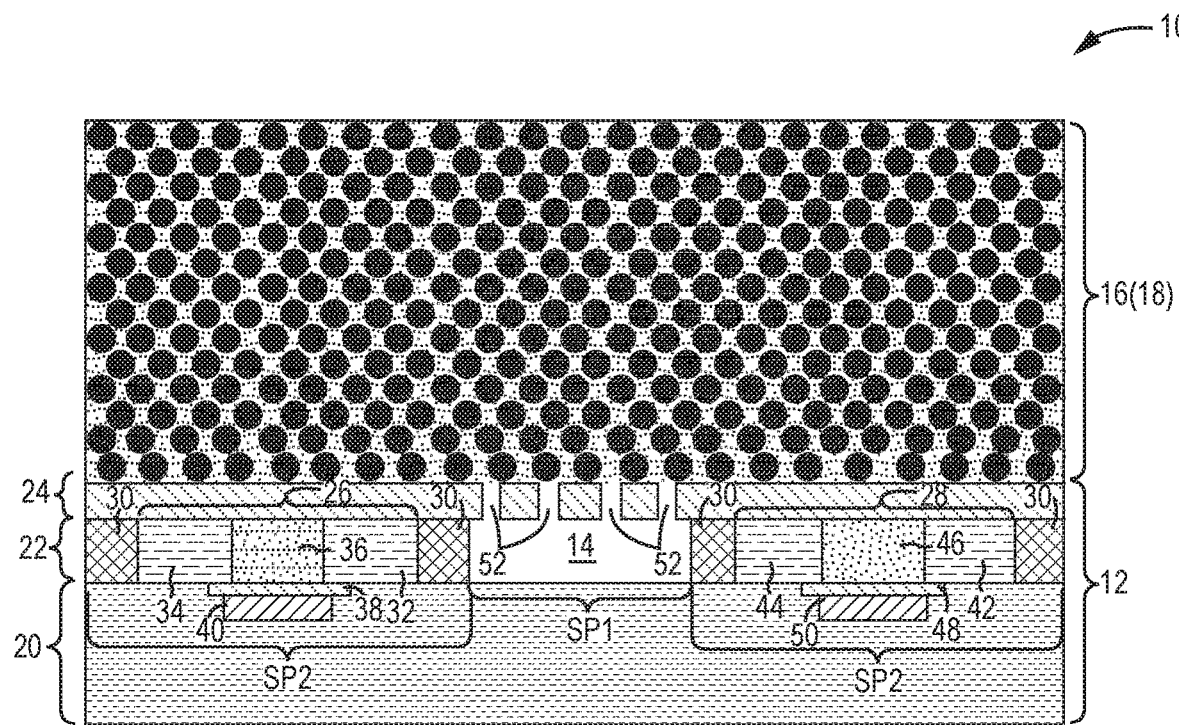
FIG. 4 shows an alternative air-cavity module according to one embodiment of the present disclosure.
Figure 5:
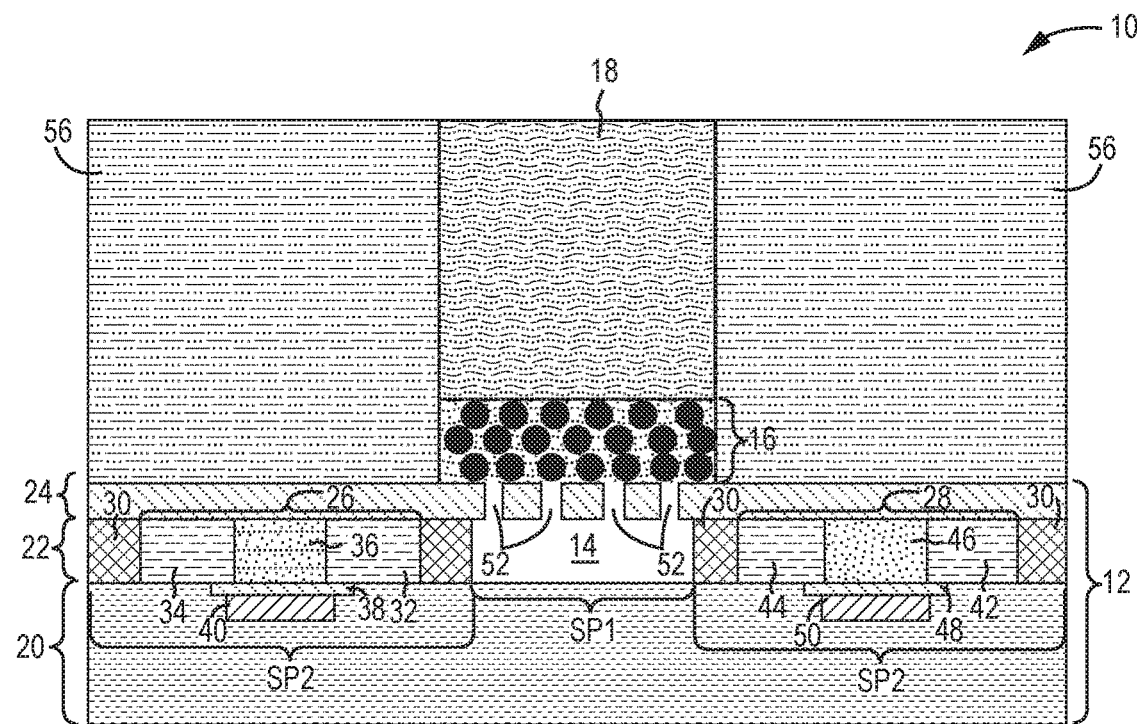
FIG. 5 shows an alternative air-cavity module according to one embodiment of the present disclosure.

In some applications, the thermally enhanced mold compound 18 may be formed from the same material as the first mold compound 16, as illustrated in FIG. 4. The first/second mold compound 16/18 may be formed from large granularity polymers that do not go through any of the discrete holes 52. In some applications, the first mold compound 16 and the thermally enhanced mold compound 18 do not cover the entire BOX layer 24. Instead, the first mold compound 16 and the thermally enhanced mold compound 18 are over a portion of the BOX layer 24, within which the discrete holes 52 are located, as illustrated in FIG. 5. Since the first mold compound 16 is formed from large granularity polymers, the first mold compound 16 will not go through any of the discrete holes 52 into the air-cavity 14. Herein, the air-cavity module 10 may further include a low permittivity mold compound 56 that resides over the remaining portions of the BOX layer 24, where the discrete holes 52 are not located. The low permittivity mold compound 56 may entirely or partially encapsulate the sides of the first mold compound 16 and the sides of the thermally enhanced mold compound 18. The low permittivity mold compound 56 may be formed from low relative permittivity materials, such as organic thermoset and thermoplastic polymer, with the relative permittivity being no more than 7 or no more than 4. Because the low permittivity mold compound 56 is adjacent to the first device section 26 and the second device section 28, a vertical parasitic coupling effect between the first device section 26 and the second device section 28 is low. Most parasitic field lines between the first device section 26 and the second device section 28 close through the low permittivity mold compound 56. The low permittivity mold compound 56 may formed of a same or different material as the thermally enhanced mold compound 18.

Figure 6:
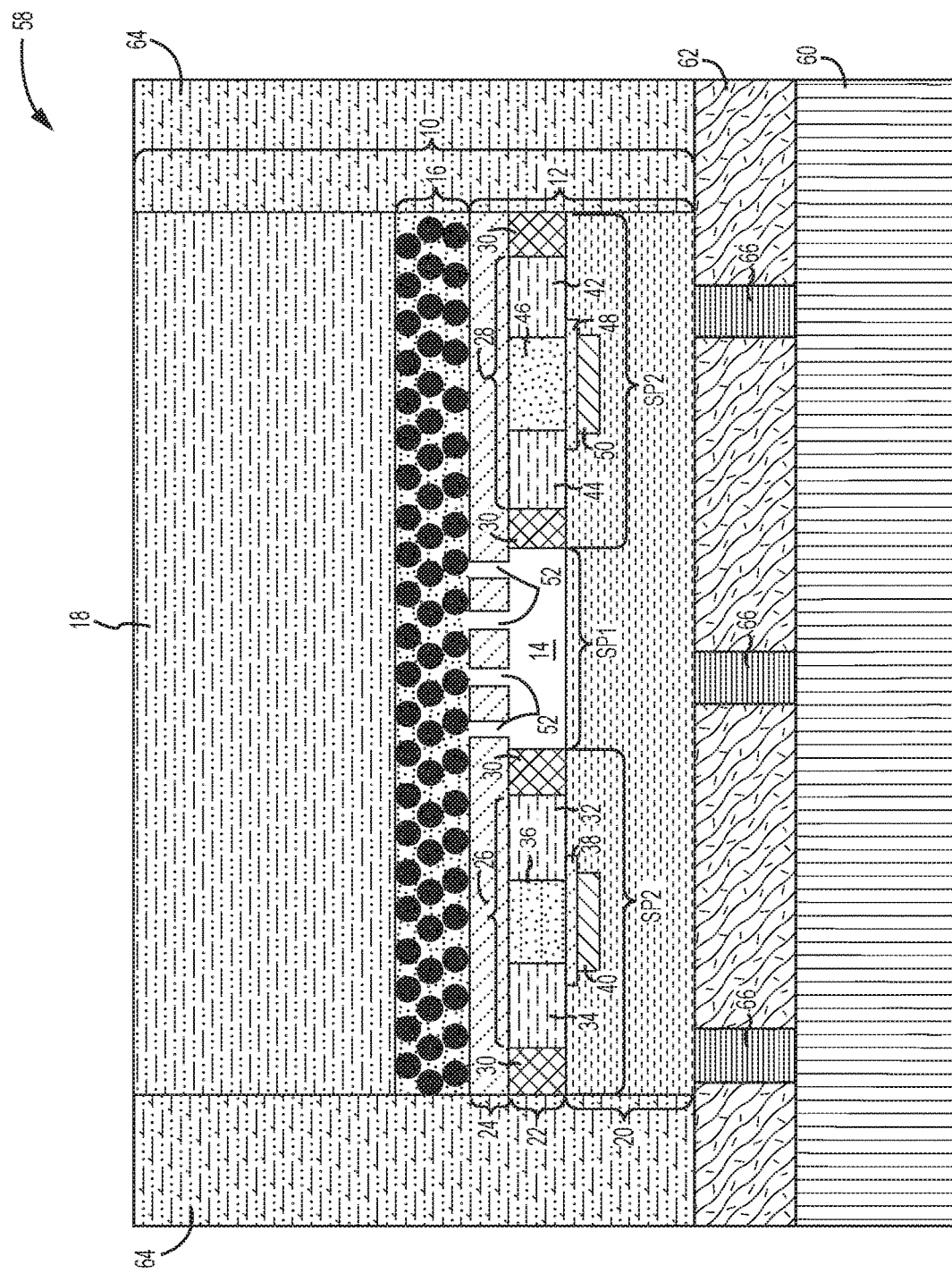
FIG. 6 shows an exemplary laminate-based semiconductor package including the air-cavity module shown in FIG. 1A.

FIG. 6 shows an exemplary laminate-based semiconductor package 58 including the air-cavity module 10 shown in FIG. 1A. Besides the air-cavity module 10, the laminate-based semiconductor package 58 also includes a module substrate 60, an underfilling layer 62, and a second mold compound 64. In this embodiment, the thinned semiconductor die 12 within the air-cavity module 10 may be a flip-flop die and further includes a number of interconnects 66 extending from a lower surface of the BEOL layer 20 (opposite the epitaxial layer 22) towards the module substrate 60.

In detail, the module substrate 60 may be formed from a laminate material, and the thinned semiconductor die 12 is coupled to an upper surface of the module substrate 60 through the interconnects 66. The second mold compound 64 resides over the upper surface of the module substrate 60 and encapsulates at least sides of the thinned semiconductor die 12, sides of the first mold compound 16, and sides of the thermally enhanced mold compound 18. In some applications, a portion of the thermally enhanced mold compound 18 may reside over an upper surface of the second mold compound 64 (not shown). Herein, the second mold compound 64 may be formed from the same or different material as the thermally enhanced mold compound 18. The second mold compound 64 does not have a relative permittivity or thermal conductivity requirement. One exemplary material used to form the second mold compound 64 is an organic epoxy resin system. The underfilling layer 62 resides between the upper surface of the module substrate 60 and the second mold compound 64, such that the underfilling layer 62 encapsulates the interconnects 66 and underfills the thinned semiconductor die 12 between the lower surface of the BEOL layer 20 and the upper surface of the module substrate 60. Herein, the underfilling layer 62 may be formed from the same or different material as the second mold compound 64.

Figure 7:
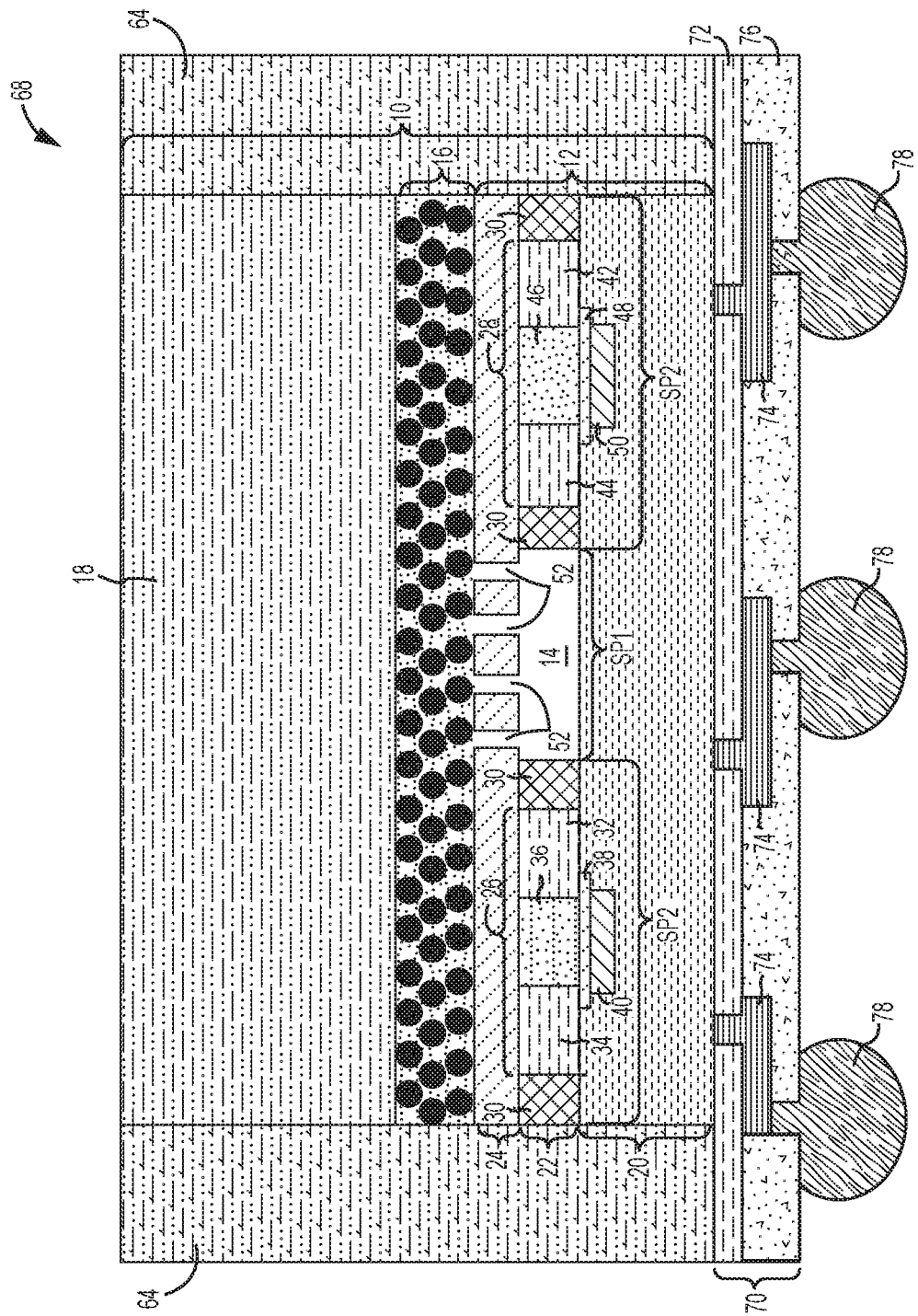
FIG. 7 shows an exemplary wafer-level package including the air-cavity module shown in FIG. 1A.

FIG. 7 shows an exemplary wafer-level package 68 including the air-cavity module 10 shown in FIG. 1A. Besides the air-cavity module 10, the wafer-level package 68 also includes a multilayer redistribution structure 70 and the second mold compound 64. Herein, the multilayer redistribution structure 70 includes a first dielectric pattern 72 at the top, a number of redistribution interconnects 74, a second dielectric pattern 76, and a number of package contacts 78.

In detail, the thinned semiconductor die 12 resides directly over an upper surface of the multilayer redistribution structure 70. As such, the BEOL layer 20 of the thinned semiconductor die 12 is in contact with the first dielectric pattern 72. In addition, input/output (I/O) ports (not shown) at the bottom surface of the BEOL layer 20 are exposed through the first dielectric pattern 72. The redistribution interconnects 74 are electrically coupled to the I/O ports (not shown) through the first dielectric pattern 72 and extend underneath the first dielectric pattern 72. The connections between the redistribution interconnects 74 and the I/O ports are solder-free. The second dielectric pattern 76 is formed underneath the first dielectric pattern 72 to partially encapsulate each redistribution interconnect 74. As such, a portion of each redistribution interconnect 74 is exposed through the second dielectric pattern 76. In different applications, there may be extra redistribution interconnects (not shown) electronically coupled to the redistribution interconnects 74 through the second dielectric pattern 76, and an extra dielectric pattern (not shown) formed underneath the second dielectric pattern 76 to partially encapsulate the extra redistribution interconnects. In this embodiment, each package contact 78 is electronically coupled to a corresponding redistribution interconnect 74 through the second dielectric pattern 76. Consequently, the redistribution interconnects 74 connect certain ones of the I/O ports (not shown) at the bottom surface of the BEOL layer 20 to certain ones of the package contacts 78 on a bottom surface of the multilayer redistribution structure 70.

The multilayer redistribution structure 70 may be free of glass fiber or glass-free. Herein, the glass fiber refers to individual glass strands twisted to become a larger grouping. These glass strands may then be woven into a fabric. The first dielectric pattern 72 and the second dielectric pattern 76 may be formed of benzocyclobutene (BCB) or polyimide. The redistribution interconnects 74 may be formed of copper or other suitable metals. The package contacts 78 may be bump contacts formed of solder alloys, such as tin or tin alloys, or may be land grid arrays (LGA) contacts. A combination of the first dielectric pattern 72, the redistribution interconnects 74, and the second dielectric pattern 76 has a thickness between 2 µm and 300 µm.

In this embodiment, the second mold compound 64 resides over the upper surface of the multilayer redistribution structure 70 and encapsulates at least the sides of the thinned semiconductor die 12, the sides of the first mold compound 16, and the sides of the thermally enhanced mold compound 18. In some applications, a portion of the thermally enhanced mold compound 18 may reside over the upper surface of the second mold compound 64 (not shown). The second mold compound 64 may be formed from the same or different material as the thermally enhanced mold compound 18.

FIGS. 8A-8D provide exemplary steps that illustrate a process to form the exemplary air-cavity module 10 shown in FIG. 1A. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 8A-8D.

Figure 8A:
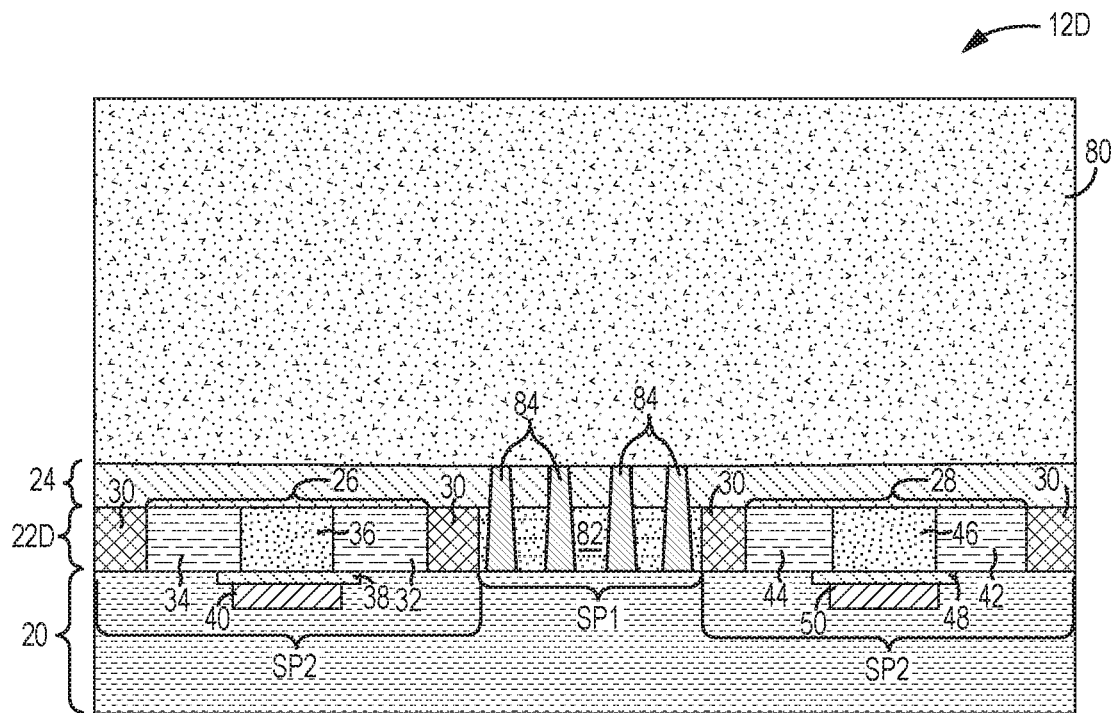
FIGS. 8A-8D illustrate an exemplary process to form the exemplary air-cavity module shown in FIG. 1A according to one embodiment of the present disclosure.

Initially, a semiconductor die 12D is provided as depicted in FIG. 8A. The semiconductor die 12D includes the BEOL layer 20, a non-air-cavity epitaxial layer 22D over the BEOL layer 20, the BOX layer 24 over the non-air-cavity epitaxial layer 22D, and a silicon handle layer 80 over the BOX layer 24. Herein, the upper surface of the BEOL layer 20 includes the first surface portion SP1 and the second surface portion SP2, which surrounds the first surface portion SP1. The non-air-cavity epitaxial layer 22D includes the first device section 26, the second device section 28, the isolation sections 30, and a sacrificial epitaxy section 82. The first device section 26 and the second device section 28 are located on opposite sides of the sacrificial epitaxy section 82. The isolation sections 30 surround the first device section 26 and the second device section 28, such that the isolation sections 30 separate the first device section 26, the second device section 28, and the sacrificial epitaxy section 82 from each other. The sacrificial epitaxy section 82 is over the first surface portion SP1 and not over the second surface portion SP2. The first device section 26, the second device section 28, and the isolation sections 30 are over the second surface portion SP2 and not over the first surface portion SP1. The BOX layer 24 may be formed of silicon oxide or the like, which may serve as an etch stop in a process to remove the silicon handle layer 80 (more details in the following discussion).

In addition, the semiconductor die 12D further includes etchable structures 84 extending through the sacrificial epitaxy section 82 and the BOX layer 24 to the silicon handle layer 80. The etchable structures 84 are distributed across the sacrificial epitaxy section 80 and not over the second surface portion SP2 of the BEOL layer 20. The etchable structures 84 may be formed from polysilicon. In different applications, there may be fewer or more etchable structures extending through the sacrificial epitaxy section 82 and the BOX layer 24. Each etchable structure 84 may or may not have the same size or shape. The shape of each etchable structure 84 may be a cuboid, a cylinder, or a circular truncated cone that has a larger opening close to the BEOL layer 20 and has a smaller opening close to the silicon handle layer 80.

Figure 8B:
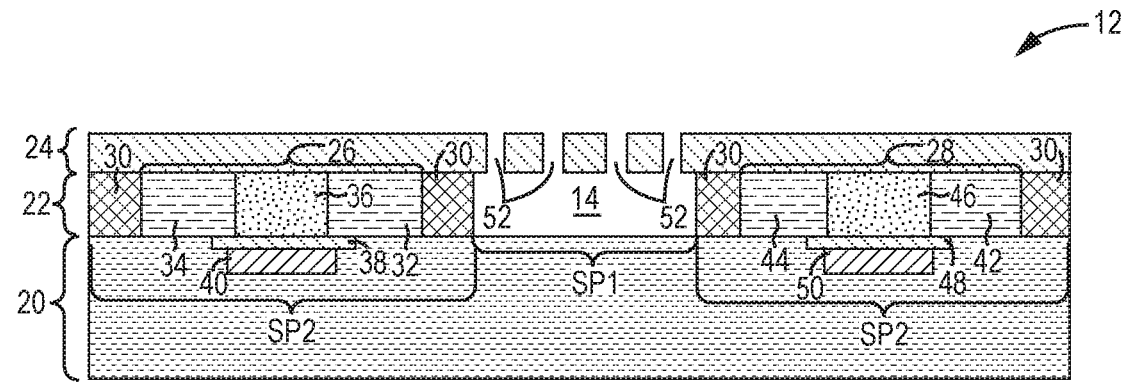

FIG. 8B shows the removal of the silicon handle layer 80, the etchable structures 84, and the sacrificial epitaxy section 82 to form the thinned semiconductor die 12. The removal step may be provided by an etching process with a wet/dry etchant chemistry, which may be KOH, ACH, NaOH or the like. Normally, these wet/dry etchant chemistries may not etch away the BOX layer 24 and the BOX layer 24 may serve as an etch stop in the etching process. However, after removing the etchable structures 84, a number of the discrete holes 52 are formed in the BOX layer 24 and over the first surface portion SP1 of the BEOL layer 20. Consequently, the sacrificial epitaxy section 82, which the etchable structures 84 extend through, is also removed to form the air-cavity 14 within the epitaxial layer 22. Since the isolation sections 30 separate the first/second device section 26/28 from the sacrificial epitaxy section 82, the wet/dry etchant chemistry does not affect the first/second device section 26/28. Herein, the air-cavity 14 is substantially isolated on all sides (the BEOL layer 20 on the bottom, the isolation sections 30 on the sides and the BOX layer 24 with discrete holes 52 on the top). Notice that, after the removal step, there is no portion of the BOX layer 24 that is floating. The portion of the BOX layer 24, within which the discrete holes 52 are located and below which the air-cavity 14 is located, gets mechanical strength from the remaining portions of the BOX layer. In one embodiment, the air-cavity 14 (the sacrificial epitaxy section 82) may not be too wide since it may not sustain in the following molding process (more details in the following discussion).

Figure 8C:
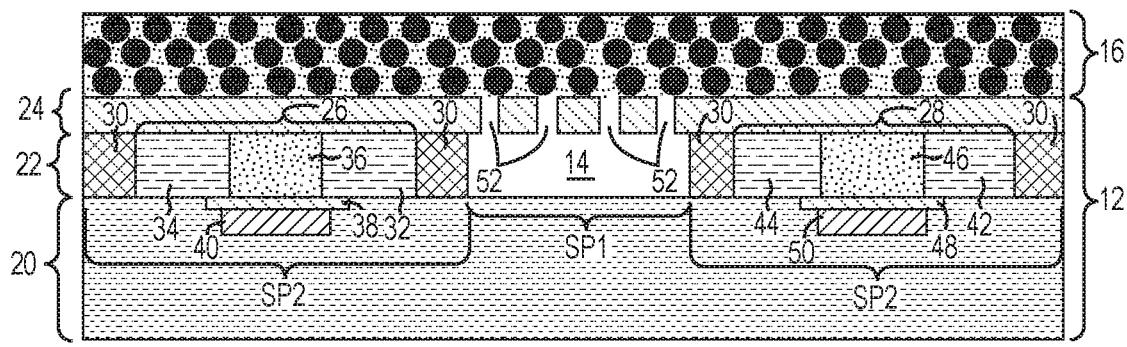

Next, the first mold compound 16 is then applied over the entirety of the thinned semiconductor die 12 and in contact with the BOX layer 24 as illustrated in FIG. 8C. The first mold compound 16 may be applied by various procedures, such as sheet molding, overmolding, compression molding, transfer molding, dam fill encapsulation, and screen print encapsulation. If the first mold compound 16 is formed by the compression molding or other molding process with a molding pressure larger than 500 psi or 1000 psi, the air-cavity 14 (the sacrificial epitaxy section 82) may have a size no larger than 50 µm×50 µm or 25 µm×25 µm. Otherwise, the molding pressure may collapse the BOX layer 24 into the air-cavity 14. The first mold compound 16 may have a thickness between 1 µm and 250 µm, and may be formed from large granularity polymers that cannot go through any of the discrete holes 52 into the air-cavity 14. The smallest polymer granule in the first mold compound 16 is larger than any of the discrete holes 52. Notice that there are no air gaps within the first mold compound 16. Resins of the polymer granules fill the gaps between the polymer granules within the first mold compound 16. In addition, the first mold compound 16 may be formed from low relative permittivity materials with the relative permittivity being no more than 7 or no more than 4. Organic thermoset and thermoplastic polymer with large granularity may be used for the first mold compound 16.

Notice that, since the first mold compound 16 will not get into the air-cavity 14 through the discrete holes 52 (because of the large granularity), the first device section 26 and the second device section 28 are laterally separated by the air-cavity 14. Consequently, the lateral parasitic coupling effect between the first device section 26 and the second device section 28 is low due to the low relative permittivity of the air (around 1). The first device section 26 and the second device section 28 have superior isolation. Further, because the first mold compound 16 is adjacent to the first device section 26 and the second device section 28, a vertical parasitic coupling effect between the first device section 26 and the second device section 28 is low. Most parasitic field lines between the first device section 26 and the second device section 28 close through the first mold compound 16.

Figure 8D:
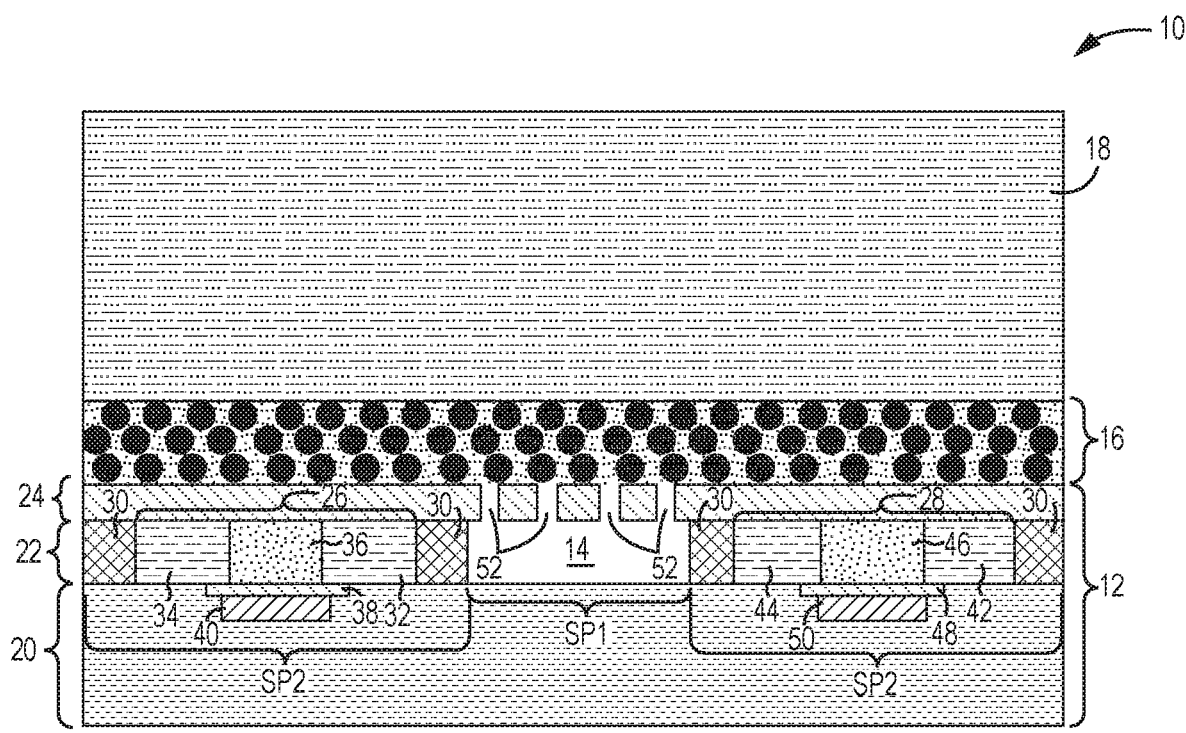

A curing process (not shown) is followed to harden the first mold compound 16. The curing temperature is between 125° C. and 300° C. depending on which material is used as the first mold compound 16. The thermally enhanced mold compound 18 is then applied over the first mold compound 16 to complete the air-cavity module 10, as illustrated in FIG. 8D. The thermally enhanced mold compound 18 may be applied by various procedures, such as sheet molding, overmolding, compression molding, transfer molding, dam fill encapsulation, and screen print encapsulation. The thermally enhanced mold compound 18 does not have a granularity requirement or a relative permittivity requirement in low parasitic coupling embodiments. The thermally enhanced mold compound 18 may have a thickness between 50 µm and 1000 µm, and have a thermal conductivity between 10 W/m·K and 50 W/mK, or between 1 W/m·K and 500 W/m·K or greater. Lastly, a curing process (not shown) is followed to harden the thermally enhanced mold compound 18. The curing temperature is between 100° C. and 320° C. depending on which material is used as the thermally enhanced mold compound 18.

FIGS. 9A-9D provide exemplary steps that illustrate a process to form the exemplary air-cavity module 10 shown in FIG. 3. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 9A-9D.

Figure 9A:
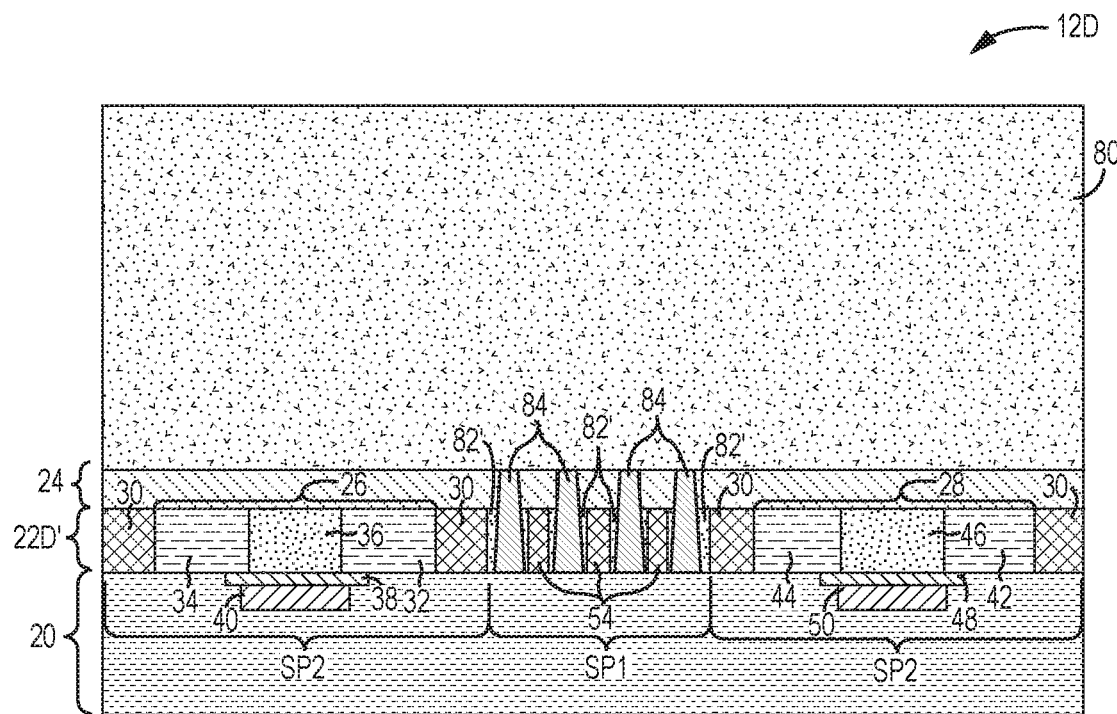
FIGS. 9A-9D illustrate an exemplary process to form the alternative air-cavity module shown in FIG. 3 according to one embodiment of the present disclosure.

Initially, the semiconductor die 12D is provided as depicted in FIG. 9A. The semiconductor die 12D includes the BEOL layer 20, a non-air-cavity epitaxial layer 22D' over the BEOL layer 20, the BOX layer 24 over the non-air-cavity epitaxial layer 22D', and the silicon handle layer 80 over the BOX layer 24. Herein, the upper surface of the BEOL layer 20 includes the first surface portion SP1 and the second surface portion SP2, which surrounds the first surface portion SP1. The non-air-cavity epitaxial layer 22D' includes the first device section 26, the second device section 28, the isolation sections 30, the support structures 54 and a number of sacrificial epitaxy sections 82'. The support structures 54 and the sacrificial epitaxy sections 82' are over the first surface portion SP1 and not over the second surface portion SP2. The first device section 26, the second device section 28, and the isolation sections 30 are over the second surface portion SP2 and not over the first surface portion SP1. The sacrificial epitaxy sections 82' and the support structures 54 are in between the first device section 26 and the second device section 28. Herein, the support structures 54 may separate the sacrificial epitaxy sections 82' from each other. The isolation sections 30 surround both the first device section 26 and the second device section 28, and separate the first device section 26 and the second device section 28 from the sacrificial epitaxy sections 82'. The isolation sections 30 and the support structures 54 may be formed of silicon oxide in a same STI process.

The BOX layer 24 may be formed of silicon oxide or the like, which may serve as an etch stop in a process to remove the silicon handle layer 80 (more details in following discussion). The support structures 54 provide mechanical support to a portion of the BOX layer 24 that is over the surface portion SP1. In addition, the semiconductor die 12D further includes the etchable structures 84. At least one of the etchable structures 84 extends through a corresponding sacrificial epitaxy section 82' and the BOX layer 24 to the silicon handle layer 80. The etchable structures 84 are over the first surface portion SP1 of the BEOL layer 20 and not over the second surface portion SP2 of the BEOL layer 20. The etchable structures 84 may be formed from polysilicon. In different applications, there may be a same or different number of the etchable structures 84 extending through each sacrificial epitaxy section 82'. Each etchable structure 84 may or may not have the same size or shape. The shape of each etchable structure 84 may be a cuboid, a cylinder, or a circular truncated cone that has a larger opening close to the BEOL layer 20 and has a smaller opening close to the silicon handle layer 80.

Figure 9B:
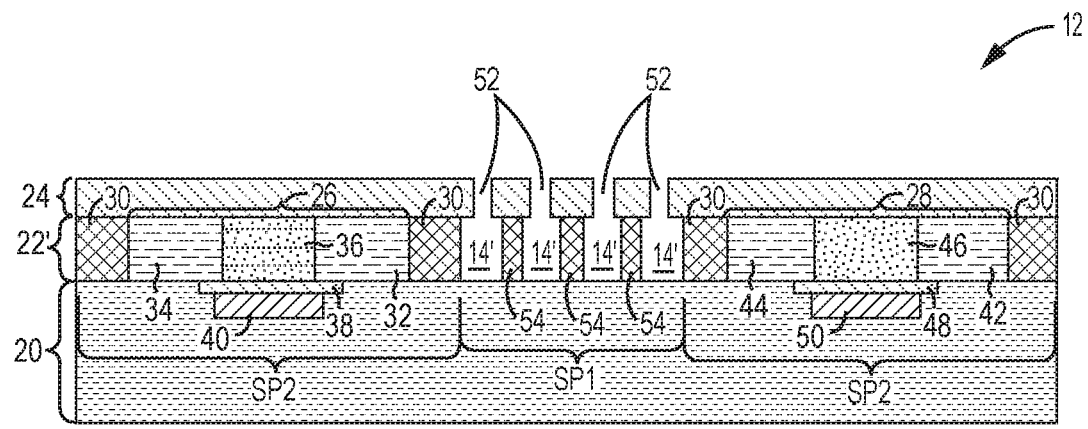

FIG. 9B shows the removal of the silicon handle layer 80, the etchable structures 84, and the sacrificial epitaxy sections 82' to form the thinned semiconductor die 12. The removal step may be provided by an etching process with a wet/dry etchant chemistry, which may be KOH, ACH, NaOH or the like. Normally, these wet/dry etchant chemistries may not etch away the BOX layer 24 and the BOX layer 24 may serve as an etch stop in the etching process. However, after removing the etchable structures 84, a number of the discrete holes 52 are formed in the BOX layer 24. Consequently, the sacrificial epitaxy sections 82', which the etchable structures 84 extend through, are also removed. Since the isolation sections 30 and the support structures 54 may be formed of silicon oxide, which can withstand the etchant chemistry, multiple air-cavities 14' are formed between the isolation sections 30 and the support structures 54 or between adjacent support structures 54. Each air-cavity 14' is directly in connection with at least one of the discrete holes 52 in the BOX layer 24.

Figure 9C:
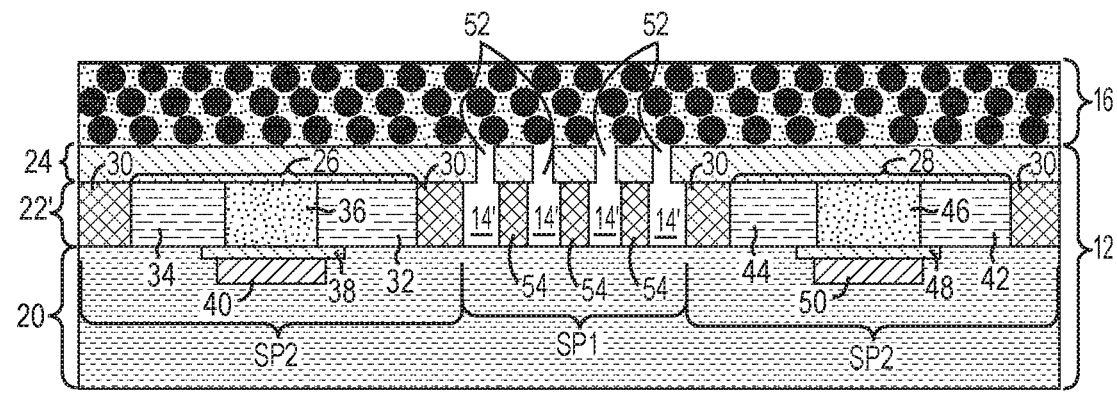

Next, the first mold compound 16 is then applied over the entirety of the thinned semiconductor die 12 and in contact with the BOX layer 24 as illustrated in FIG. 9C. The first mold compound 16 may be applied by various procedures, such as sheet molding, overmolding, compression molding, transfer molding, dam fill encapsulation, and screen print encapsulation. It is clear that the support structures 54 provide extra support to the portion of the BOX layer 24, within which the discrete holes 52 are located. As such, the portion of the BOX layer 24, within which the discrete holes 52 are located, may endure higher molding pressures. The first mold compound 16 may have a thickness between 1 μm and 250 μm, and may be formed from large granularity polymers that cannot go through any of the discrete holes 52 into any air-cavity 14'. The smallest polymer granule in the first mold compound 16 is larger than any of the discrete holes 52. Notice that there are no air gaps within the first mold compound 16. Resins of the polymer granules fill the gaps between the polymer granules within the first mold compound 16. In addition, the first mold compound 16 may be formed from low relative permittivity materials with the relative permittivity being no more than 7 or no more than 4. Organic thermoset and thermoplastic polymer with large granularity may be used for the first mold compound 16.

Figure 9D:
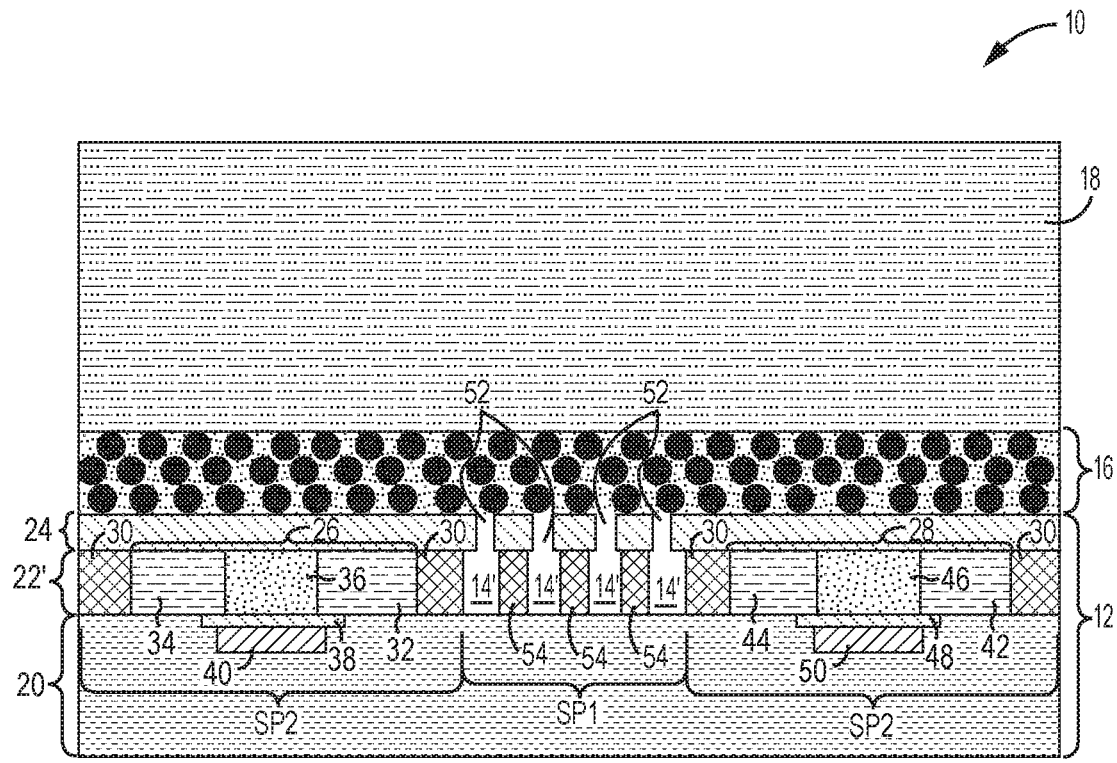

A curing process (not shown) is followed to harden the first mold compound 16. The curing temperature is between 125° C. and 300° C. depending on which material is used as the first mold compound 16. The thermally enhanced mold compound 18 is then applied over the first mold compound 16 to complete the air-cavity module 10, as illustrated in FIG. 9D. The thermally enhanced mold compound 18 may be applied by various procedures, such as sheet molding, overmolding, compression molding, transfer molding, dam fill encapsulation, and screen print encapsulation. The thermally enhanced mold compound 18 does not have a granularity requirement or a relative permittivity requirement in low parasitic coupling embodiments. The thermally enhanced mold compound 18 may have a thickness between 50 μm and 1000 μm, and have a thermal conductivity between 10 W/m·K and 50 W/mK, or between 1 W/m·K and 500 W/m·K or greater. Lastly, a curing process (not shown) is followed to harden the thermally enhanced mold compound 18. The curing temperature is between 100° C. and 320° C. depending on which material is used as the thermally enhanced mold compound 18.

FIGS. 10A-10G provide exemplary steps to form the air-cavity module 10 shown in FIG. 5. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 10A-10G.

Figure 10A:
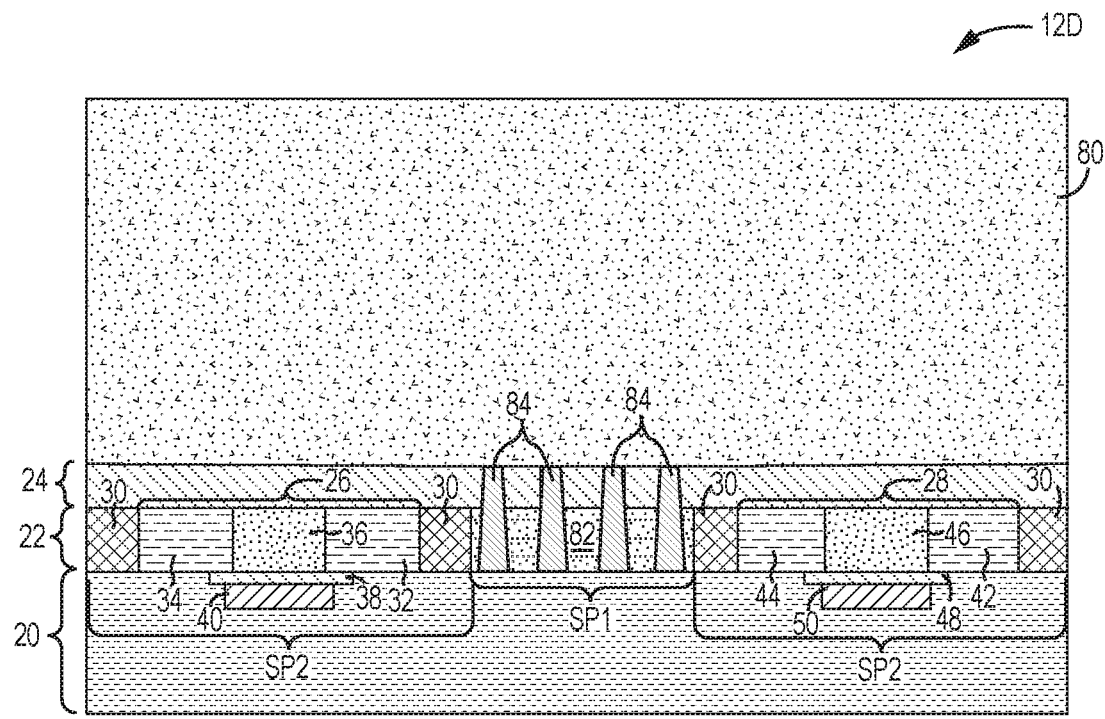
FIGS. 10A-10G illustrate an exemplary process to form the alternative air-cavity module shown in FIG. 5 according to one embodiment of the present disclosure.
Figure 10B:
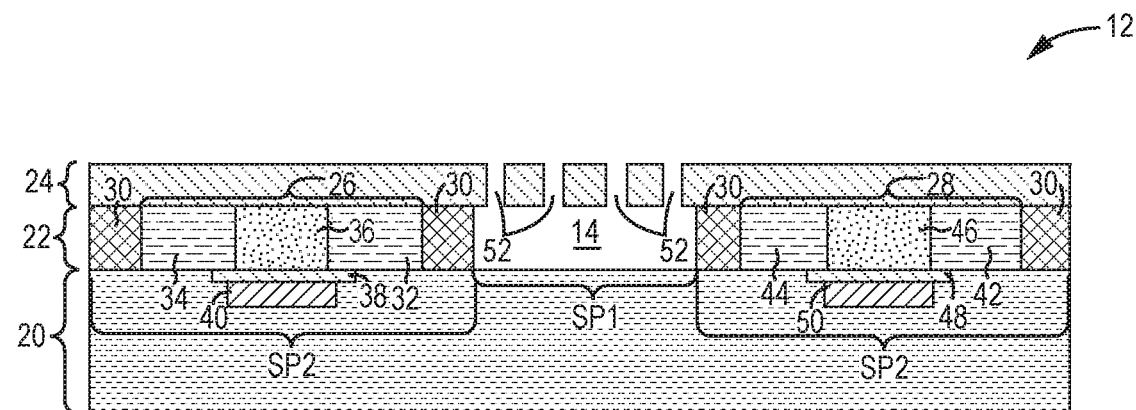
Figure 10C:
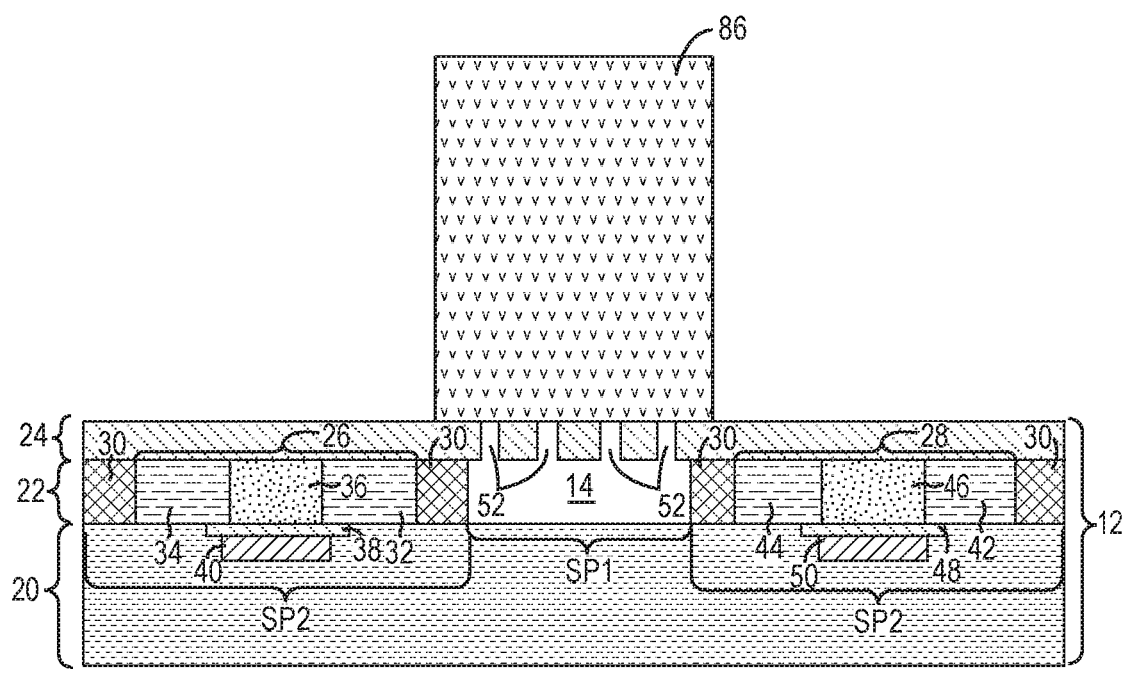

FIGS. 10A-10B show the same steps to form the thinned semiconductor die 12 as FIGS. 8A-8B. Next, a molding block 86 is placed over a portion of the BOX layer 24, within which the discrete holes 52 are located, as illustrated in FIG. 10C. The remaining portions of the BOX layer 24 are exposed. The molding block 86 covers all of the discrete holes 52. The molding block 86 may be formed from a suitable patternable sacrificial material, such as polyimide, with a height between 2 μm and 300 μm.

Figure 10D:
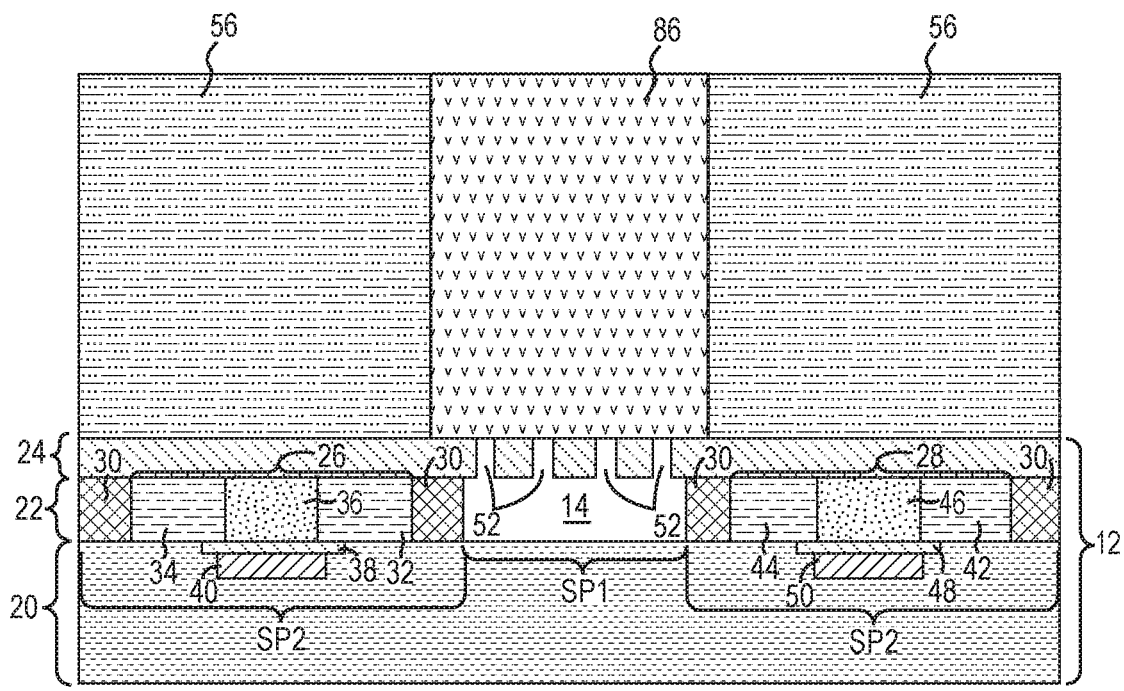

The low permittivity mold compound 56 is then applied over the exposed portions of the BOX layer 24, as illustrated in FIG. 10D. The low permittivity mold compound 56 surrounds the molding block 86 and does not reside over any discrete hole 52. The low permittivity mold compound 56 may be applied by various procedures, such as sheet molding, overmolding, compression molding, transfer molding, dam fill encapsulation, and screen print encapsulation. A curing process (not shown) is followed to harden the third mold compound. The curing temperature is between 125° C. and 300° C. depending on which material is used as the low permittivity mold compound 56.

Figure 10E:
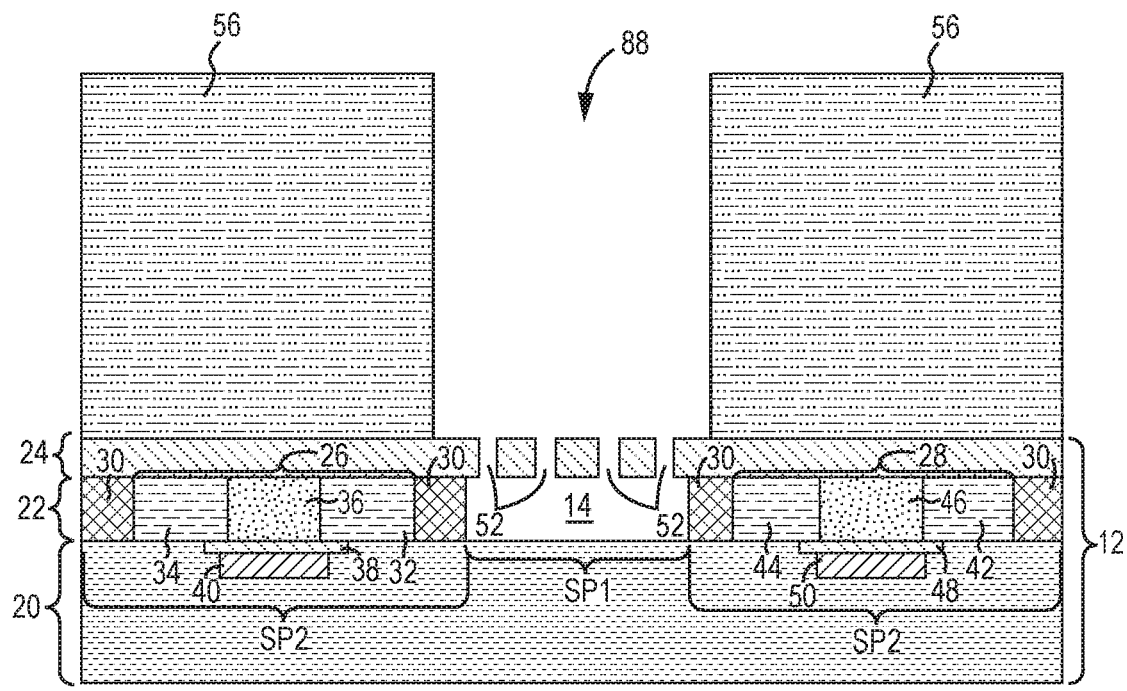

Next, the molding block 86 is removed to form an opening 88 within the low permittivity mold compound 56 as illustrated in FIG. 10E. The portion of the BOX layer 24, within which the discrete holes 52 are located, is exposed at the bottom of the opening 88. The removal of the molding block 86 may be provided by a dry or wet selective etching process. If the molding block 86 is formed from polyimide, a hot NaOH or KOH solution may be used in selectively removing the molding block 86.

Figure 10F:
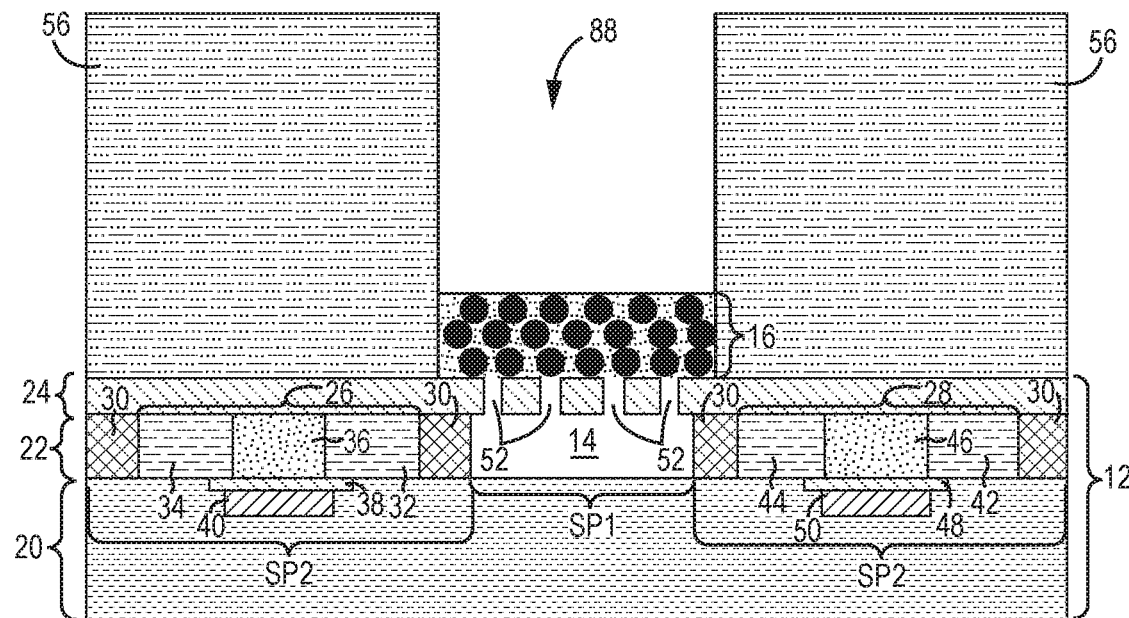
Figure 10G:
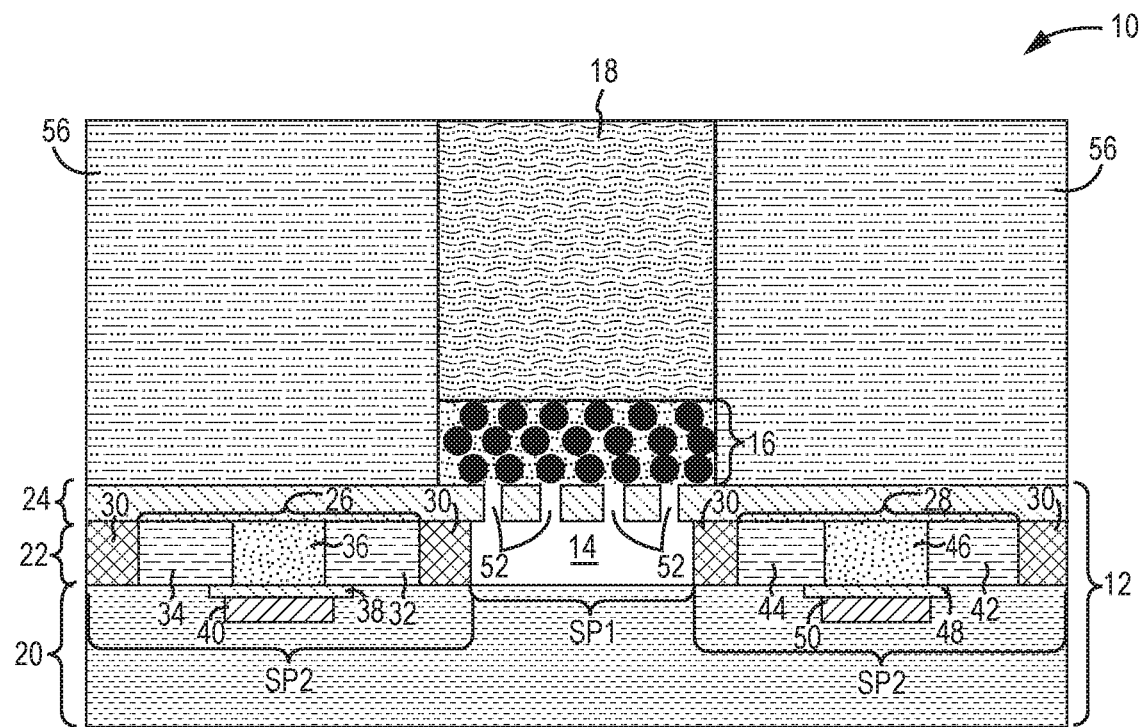

With reference to FIGS. 10F through 10G, process steps to complete the air-cavity 10 are illustrated according to one embodiment of the present disclosure. As shown in FIG. 10F, the first mold compound 16 is applied at the bottom of the opening 88 and directly over the exposed portion of the BOX layer 24, within which the discrete holes 52 are located. The first mold compound 16 may have a thickness between 1 μm and 250 μm, and may be formed from large granularity polymers that cannot go through any of the discrete holes 52 into the air-cavity 14. The smallest polymer granule in the first mold compound 16 is larger than any of the discrete holes 52. Notice that there are no air gaps within the first mold compound 16. Resins of the polymer granules fill the gaps between the polymer granules within the first mold compound 16. In addition, the first mold compound 16 may be formed from low relative permittivity materials with the relative permittivity being no more than 7 or no more than 4. Organic thermoset and thermoplastic polymer with large granularity may be used for the first mold compound 16. The first mold compound 16 may be applied by various procedures, such as sheet molding, overmolding, compression molding, transfer molding, dam fill encapsulation, and screen print encapsulation.

A curing process (not shown) is followed to harden the first mold compound 16. The curing temperature is between 125° C. and 300° C. depending on which material is used as the first mold compound 16. The thermally enhanced mold compound 18 is then applied at the top of the opening 88 and over the first mold compound 16 to complete the air-cavity module 10, as illustrated in FIG. 10G. The thermally enhanced mold compound 18 may be applied by various procedures, such as sheet molding, overmolding, compression molding, transfer molding, dam fill encapsulation, and screen print encapsulation. The thermally enhanced mold compound 18 does not have a granularity requirement or a relative permittivity requirement in low parasitic coupling embodiments. The thermally enhanced mold compound 18 may have a thickness between 50 µm and 1000 µm, and a portion of the thermally enhanced mold compound 18 may reside over an upper surface of the low permittivity mold compound 56 (not shown). The thermal conductivity of the second mold compound may be between 10 W/m·K and 50 W/mK, or between 1 W/m·K and 500 W/m·K or greater. Lastly, a curing process (not shown) is followed to harden the thermally enhanced mold compound 18. The curing temperature is between 100° C. and 320° C. depending on which material is used as the thermally enhanced mold compound 18.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a thinned semiconductor die comprising:
      a back-end-of-line (BEOL) layer having an upper surface that includes a first surface portion and a second surface portion surrounding the first surface portion;
      an epitaxial layer residing over the upper surface of the BEOL layer and comprising an air-cavity, a first device section, and a second device section, wherein:
         the air-cavity is over the first surface portion and not over the second surface portion, wherein no device component within the air cavity is electrically coupled to the first device section or the second device section;
         the first device section and the second device section are located on opposite sides of the air-cavity; and
         the first device section and the second device section are over the second surface portion and not over the first surface portion; and
      a buried oxide (BOX) layer having a plurality of discrete holes and residing over the epitaxial layer, wherein the plurality of discrete holes are over the first surface portion and not over the second surface portion, and directly in connection with the air-cavity; and
   a first mold compound directly over at least a portion of the BOX layer, within which the plurality of discrete holes are located, wherein the first mold compound does not enter into the air-cavity of the epitaxial layer through the plurality of discrete holes within the BOX layer.

2. The apparatus of claim 1 wherein the first mold compound has a relative permittivity of no more than 7.

3. The apparatus of claim 1 wherein the first mold compound has a relative permittivity of no more than 4.

4. The apparatus of claim 1 wherein the first mold compound comprises polymer granules, wherein each polymer granule is larger than any of the plurality of discrete holes.

5. The apparatus of claim 4 wherein a diameter of each of the plurality of discrete holes is between 0.1 µm and 100 µm, and a diameter of each polymer granule is between 0.2 µm and 500 µm.

6. The apparatus of claim 4 wherein a diameter of each of the plurality of discrete holes is between 0.2 µm and 1 µm, and a diameter of each polymer granule is between 0.5 µm and 50 µm.

7. The apparatus of claim 4 wherein a shape of each of the plurality of discrete holes is one of a group consisting of a cuboid, a cylinder, and a circular truncated cone.

8. The apparatus of claim 1 further comprising a thermally enhanced mold compound that resides over the first mold compound.

9. The apparatus of claim 8 wherein the first mold compound and the thermally enhanced mold compound are formed from an identical material.

10. The apparatus of claim 8 wherein the first mold compound and the thermally enhanced mold compound are formed from different materials.

11. The apparatus of claim 1 wherein the epitaxial layer further comprises isolation sections, wherein:
    the isolation sections surround the first device section and the second device section, and separate the first device section and the second device section from the air-cavity; and
    the isolation sections are over the second surface portion and not over the first surface portion.

12. The apparatus of claim 1 wherein the first device section includes a first source, a first drain, and a first channel for a first field effect transistor (FET), and the second device section includes a second source, a second drain, and a second channel for a second FET.

13. The apparatus of claim 1 wherein the first mold compound is directly over the entirety of the BOX layer.

14. The apparatus of claim 1 further comprising a low permittivity mold compound, wherein:
    the first mold compound resides directly over a first portion of the BOX layer, within which the plurality of discrete holes are located;
    the low permittivity mold compound resides directly over second portions of the BOX layer, within which the plurality of discrete holes are not located; and
    the low permittivity mold compound at least partially encapsulates sides of the first mold compound.

15. The apparatus of claim 14 wherein the low permittivity mold compound has a relative permittivity of no more than 7.

16. The apparatus of claim 14 further comprising a thermally enhanced mold compound that resides over the first mold compound, wherein the low permittivity mold compound at least partially encapsulates sides of the thermally enhanced mold compound.

17. The apparatus of claim 16 wherein the low permittivity mold compound and the thermally enhanced mold compound are formed from an identical material.

18. The apparatus of claim 16 wherein the low permittivity mold compound and the thermally enhanced mold compound are formed from different materials.

19. The apparatus of claim 1 further comprising a module substrate and a second mold compound, wherein:
    the thinned semiconductor die is a flip-chip die and further includes a plurality of interconnects extending from a lower surface of the BEOL layer towards an upper surface of the module substrate; and
    the second mold compound resides over the upper surface of the module substrate and encapsulates at least sides of the first mold compound and the thinned semiconductor die.

20. The apparatus of claim 1 further comprising a multilayer redistribution structure and a second mold compound wherein:
    the thinned semiconductor die resides directly over an upper surface of the multilayer redistribution structure; and
    the second mold compound resides over the upper surface of multilayer redistribution structure and encapsulates at least sides of the first mold compound and the thinned semiconductor die.

21. An apparatus comprising:
a thinned semiconductor die comprising:
  a back-end-of-line (BEOL) layer having an upper surface that includes a first surface portion and a second surface portion surrounding the first surface portion;
  an epitaxial layer residing over the upper surface of the BEOL layer and comprising air-cavities, support structures, a first device section, and a second device section, wherein:
    the air-cavities and the support structures are over the first surface portion and not over the second surface portion;
    the first device section and the second device section are over the second surface portion and not over the first surface portion;
    the air-cavities are in between the first device section and the second device section; and
    the air-cavities are separated from each other by the support structures; and
  a buried oxide (BOX) layer having a plurality of discrete holes and residing over the epitaxial layer, wherein:
    the plurality of discrete holes are over the first surface portion and not over the second surface portion;
    each air-cavity is directly in connection with at least one of the plurality of discrete holes; and
    the support structures provide mechanical support to a first portion of the BOX layer, within which the plurality of discrete holes are located; and
  a first mold compound directly over at least the first portion of the BOX layer, wherein the first mold compound does not enter into the air-cavities of the epitaxial layer through the plurality of discrete holes within the BOX layer.

* * * * *